United States Patent
Tanaka

(10) Patent No.: US 9,764,940 B2
(45) Date of Patent: Sep. 19, 2017

(54) ELECTRONIC DEVICE, ELECTRONIC APPARATUS, AND MOVING OBJECT

(71) Applicant: Seiko Epson Corporation, Tokyo (JP)

(72) Inventor: Satoru Tanaka, Chino (JP)

(73) Assignee: Seiko Epson Corporation (JP)

( * ) Notice: Subject to any disclaimer, the term of this patent is extended or adjusted under 35 U.S.C. 154(b) by 253 days.

(21) Appl. No.: 14/688,310

(22) Filed: Apr. 16, 2015

(65) Prior Publication Data

US 2015/0298967 A1  Oct. 22, 2015

(30) Foreign Application Priority Data

Apr. 18, 2014  (JP) ................. 2014-086545

(51) Int. Cl.
*G01P 15/125* (2006.01)
*B81B 3/00* (2006.01)
*G01P 15/08* (2006.01)

(52) U.S. Cl.
CPC .......... *B81B 3/0008* (2013.01); *G01P 15/125* (2013.01); *G01P 2015/0814* (2013.01)

(58) Field of Classification Search
CPC ................. B81B 3/0008; G01P 15/125; G01P 2015/0814
USPC .............................................. 73/488, 514.32
See application file for complete search history.

(56) References Cited

U.S. PATENT DOCUMENTS

| | | | |
|---|---|---|---|
| 5,780,742 A * | 7/1998 | Burns | G01P 15/097 73/514.18 |
| 6,257,057 B1 * | 7/2001 | Hulsing, II | G01C 19/5719 73/504.04 |
| 8,096,180 B2 | 1/2012 | Yamanaka et al. | |
| 2001/0032508 A1 * | 10/2001 | Lemkin | G01P 15/125 73/514.32 |
| 2008/0314147 A1 * | 12/2008 | Nasiri | G01P 15/125 73/514.32 |

FOREIGN PATENT DOCUMENTS

| | | |
|---|---|---|
| JP | 2002-318244 A | 10/2002 |
| JP | 2003-014777 A | 1/2003 |
| JP | 2009-145321 A | 7/2009 |
| JP | 2011-058819 A | 3/2011 |
| JP | 2013-011549 A | 1/2013 |
| JP | 2013-167469 A | 8/2013 |

* cited by examiner

*Primary Examiner* — Max Noori
(74) *Attorney, Agent, or Firm* — Harness, Dickey & Pierce, P.L.C.

(57) ABSTRACT

An electronic device includes a first functional element including a first movable element capable of moving in a first axis direction, and a first dummy electrode; a second functional element including a second movable element capable of moving in a second axis direction intersecting with the first axis direction, and a second dummy electrode; and a first wiring interconnecting the first dummy electrode and the second dummy electrode.

17 Claims, 12 Drawing Sheets

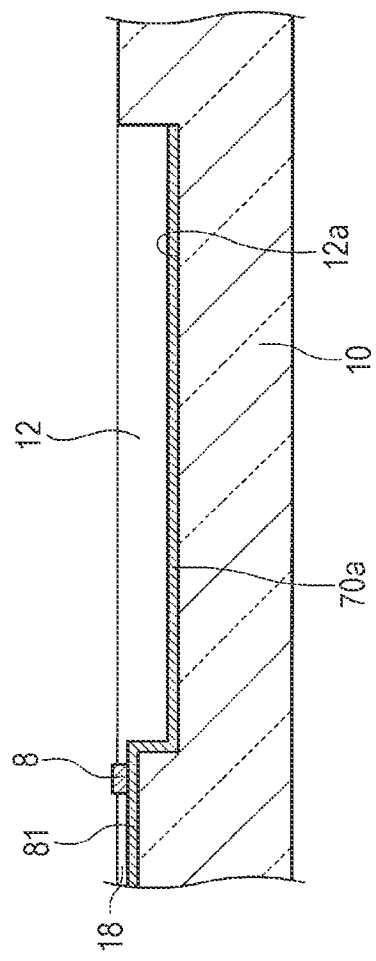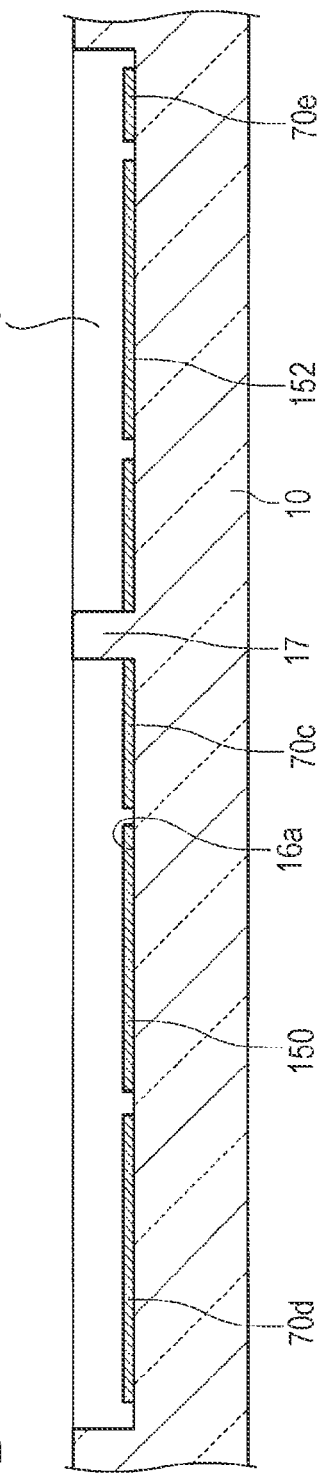

ELECTRONIC DEVICE, ELECTRONIC APPARATUS, AND MOVING OBJECT

BACKGROUND

1. Technical Field

The present invention relates to an electronic device, an electronic apparatus, and a moving object.

2. Related Art

Recently, through the use of, for example, silicon micro electro mechanical systems (MEMS) technologies, functional elements (physical-quantity sensors) for detecting physical quantities, such as acceleration, have been developed.

Such a functional element is capable of detecting acceleration on the basis of a capacitance between a fixed electrode fixed to a supporting substrate and a movable electrode provided in a movable portion capable of moving in accordance with the acceleration. In such a functional element, there sometimes occurs a phenomenon in which the movable electrode is pulled toward the side of the supporting substrate by electrostatic forces caused by an electric potential difference arising between the movable electrode and the supporting substrate and, as a result, the movable electrode is adhered to the supporting substrate.

For example, in JP-A-2013-11549, there is disclosed a manufacturing method for a physical-quantity sensor, which enables prevention of adherence of a movable portion of a sensor portion to a glass substrate through a method of anodic bonding of the glass substrate to a semiconductor substrate in a state in which a conductive film (a dummy electrode) and the semiconductor substrate are in contact with each other.

Here, in an electronic device capable of detecting acceleration in each of three axis directions, such as one disclosed in JP-A-2013-167469, sometimes, three dummy electrodes are each provided in a corresponding one of three functional elements each associated with a corresponding one of the three axis directions, thereby, for example, preventing movable portions from being adhered to a substrate. In such an electronic device, in order to supply an electric potential to the three dummy electrodes, as many as three terminals, through each of which the electric potential is supplied to a corresponding one of the three dummy electrodes, are required to be provided, thereby sometimes making it difficult to realize downsizing of the electronic device.

SUMMARY

An advantage of some aspects of the invention is that an electronic device is provided that is configured to be able to be downsized. Another advantage of some aspects of the invention is that an electronic apparatus incorporating the above electronic device and a moving object incorporating the above electronic device are provided.

The invention can be embodied as application examples or an embodiment which will be described below.

Application Example 1

An electronic device according to this application example includes a first functional element including a first movable element capable of moving in a first axis direction, and a first dummy electrode; a second functional element including a second movable element capable of moving in a second axis direction intersecting with the first axis direction, and a second dummy electrode; and a first wiring interconnecting the first dummy electrode and the second dummy electrode.

In such an electronic device, it is possible to supply an electric potential to the two dummy electrodes through a single terminal. Thus, such an electronic device according to application example 1 is configured to, as compared with a case where two terminals are provided in order to supply an electric potential to each of the two dummy electrodes through a corresponding one of the two terminals, be able to make the number of the terminals smaller. As a result, such an electronic device according to application example 1 is configured to be able to be downsized.

Application Example 2

An electronic device according to this application may be configured to, in the electronic device, additionally include a third functional element including a third movable element capable of moving in a third axis direction intersecting with the first axis direction and the second axis direction, and a third dummy electrode; and a second wiring interconnecting the second dummy electrode and the third dummy electrode.

In such an electronic device, the first dummy electrode, the second dummy electrode, and the third dummy electrode are electrically connected to one another, and thus, it is possible to supply an electric potential to these three dummy electrodes through a single terminal. Thus, such an electronic device according to application example 2 is configured to, as compared with a case where three terminals are provided in order to supply an electric potential to each of the three dummy electrodes through a corresponding one of the three terminals, be able to make the number of the terminals smaller.

Application Example 3

An electronic device according to this application example may be configured such that, in the electronic device, the first dummy electrode is electrically connected to the first movable element, the second dummy electrode is electrically connected to the second movable element, and the third dummy electrode is electrically connected to the third movable element.

In such an electronic device, it is possible to supply an electric potential to the three movable elements, that is, the first, second, and third movable elements, and the three dummy electrodes, that is, the first, second, and third dummy electrodes, through a single terminal. Thus, such an electronic device according to application example 3 is configured to, as compared with a case where mutually different terminals are provided in order to supply an electric potential to each of the movable elements and dummy electrodes through a corresponding one of the mutually different terminals, to be able to make the number of the terminals smaller.

In addition, in this patent description, a phrase "electrically connected" is used, for example, in such expression "a specific member (hereinafter, referred to as "A member") "electrically connected" to another specific member (hereinafter, referred to as "B member"). In this patent description, the phrase "electrically connected" is used under a definition that, in such a case of the above expression, the meaning of the phrase includes two cases, one being a case where A member and B member are electrically connected to each other in the state of being in direct contact with each other, the other one being a case where A member and B member are electrically connected to each other via another member.

Application Example 4

An electronic device according to this application example may be configured to, in the electronic device, additionally include a third wiring interconnecting the second dummy electrode and a fourth dummy electrode that is further included in the third functional element.

In such an electronic device, the first dummy electrode, the second dummy electrode, the third dummy electrode, and the fourth dummy electrode are electrically connected to one another, and thus, it is possible to supply an electric potential to these four dummy electrodes through a single terminal. Thus, such an electronic device according to application example 4 is configured to, as compared with a case where four terminals are provided in order to supply an electric potential to each of the four dummy electrodes through a corresponding one of the four terminals, be able to make the number of the terminals smaller.

Application Example 5

An electronic device according to this application example may be configured to, in the electronic device, additionally include a fourth wiring interconnecting the first dummy electrode and a fifth dummy electrode that is further included in the third functional element.

In such an electronic device, the first dummy electrode, the second dummy electrode, the third dummy electrode, the fourth dummy electrode, and the fifth dummy electrode are electrically connected to one another, and thus, it is possible to supply an electric potential to these five dummy electrodes through a single terminal. Thus, such an electronic device according to application example 5 is configured to, as compared with a case where five terminals are provided in order to supply an electric potential to each of the five dummy electrodes through a corresponding one of the five terminals, be able to make the number of the terminals smaller.

Application Example 6

An electronic device according to this application example may be configured such that, in the electronic device, the second functional element is provided at a position located at one first axis side of the first functional element in the first axis direction, and the third functional element is provided at a position being located at one first axis side of the first functional element in the first axis direction, and being located at one second axis side of the second functional element in the second axis direction.

Such an electronic device is configured to be able to be downsized.

Application Example 7

An electronic device according to this application example may be configured such that, in the electronic device, a width of the first functional element in the second axis direction is larger than a width of the first functional element in the first axis direction, a width of the second functional element in the first axis direction is larger than a width of the second functional element in the second axis direction, and a width of the third functional element in the first axis direction is larger than a width of the third functional element in the second axis direction.

Such an electronic device is configured to, as compared with a case where, for example, the three functional elements are arranged in the first axis direction, be able to make the width (size) of the electronic device in the first axis direction narrower (smaller) through a method of providing the second functional element at a position located at one first axis side of the first functional element in the first axis direction, and the third functional element at a position being located at one first axis side of the first functional element in the first axis direction, and being located at one second axis side of the second functional element in the second axis direction.

Application Example 8

An electronic device according to this application example may be configured to, in the electronic device according to any one of application examples 1 to 7, additionally include a terminal electrically connected to the first dummy electrode and the second dummy electrode.

Such an electronic device is configured to be able to be downsized.

Application Example 9

An electronic device according to this application example may be configured such that, in the electronic device according to any one of application examples 1 to 7, the first dummy electrode, the second dummy electrode, and the first wiring are provided as a unified structure.

Such an electronic device is configured to be able to make a probability of the occurrence of a broken wiring failure smaller, as compared with a case where each of the dummy electrodes is composed of a member different from a member of the wiring.

Application Example 10

An electronic apparatus according to this application example includes the electronic device.

Such an electronic apparatus includes the electronic device according to any one of application examples, and thus, is configured to be able to be downsized.

Application Example 11

A moving object according to this application example includes the electronic device according to any one of application examples.

Such an electronic apparatus includes the electronic device according to any one of application examples, and thus, is configured to be able to be downsized.

BRIEF DESCRIPTION OF THE DRAWINGS

The invention will be described with reference to the accompanying drawings, wherein like numbers reference like elements.

FIGS. 7A and 7B are cross-sectional views each schematically illustrating a manufacturing process for an electronic device according to an embodiment.

DESCRIPTION OF EXEMPLARY EMBODIMENTS

Hereinafter, a preferred embodiment of the invention will be described in detail with reference to some of the drawings. It is to be noted that an embodiment described below does not unreasonably limit the content of the invention set forth in an aspect of the invention. Further, all configurations described below are not necessarily essential constituent requirements of the invention.

1. Electronic Device

Figure 1:
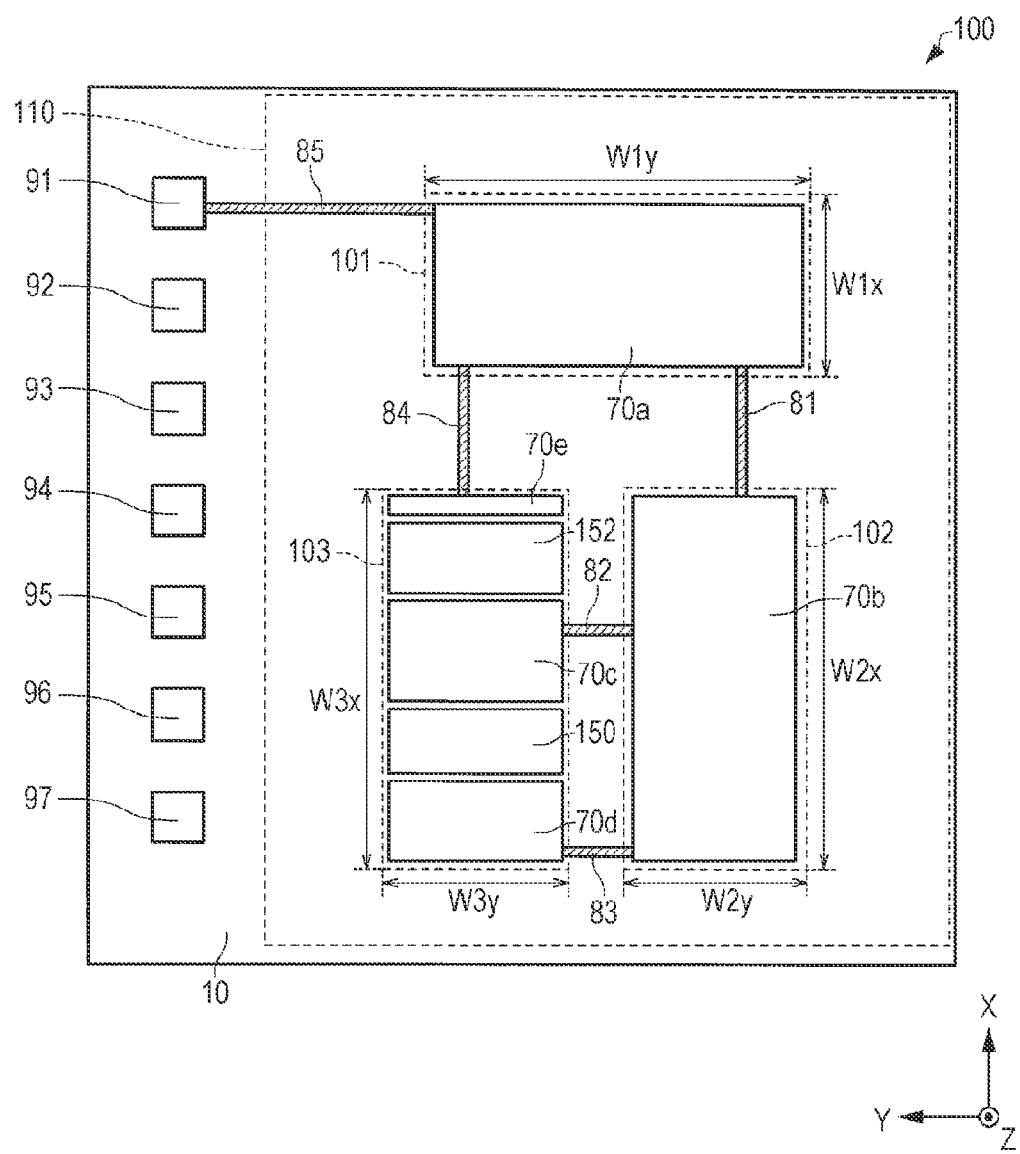
FIG. 1 is a plan view schematically illustrating an electronic device according to an embodiment.

First, an electronic device according to this embodiment will be described with reference to some of the drawings. FIG. 1 is a plan view schematically illustrating an electronic device 100 according to this embodiment. In addition, in FIG. 1 and FIGS. 2 to 6 shown below, as three mutually orthogonal axes, an X-axis (a first axis), a Y-axis (a second axis), and a Z-axis (a third axis) are illustrated.

As shown in FIG. 1, the electronic device 100 includes a substrate 10; wirings 81, 82, 83, 84, and 85; terminals 91, 92, 93, 94, 95, 96, and 97; functional elements 101, 102, and 103; and a cover 110.

In addition, in FIG. 1, a state seen through the cover 110 is illustrated for the sake of convenience. Further, in FIG. 1, the functional elements 101, 102, and 103 are illustrated in a simplified manner. Further, in FIG. 1, concave portions 12, 14, and 16, and groove portions 18, which are provided in the substrate 10, are omitted from illustration.

Hereinafter, a case where each of the functional elements 101, 102, and 103 is a physical-quantity sensor will be described. Specifically, there will be described an example in which the first functional element 101 is an acceleration sensor (a capacitance-type MEMS acceleration sensor) for detecting acceleration in a horizontal direction (in the X-axis direction (in the first axis direction)), the second functional element 102 is an acceleration sensor for detecting acceleration in a horizontal direction (in the Y-axis direction (in the second axis direction)), and the third functional element is an acceleration sensor for detecting acceleration in a vertical direction (in the Z-axis direction (in the third direction)).

The substrate 10 is made of a material of, for example, glass or silicon. The cover 110 is provided above the substrate 10. The substrate 10 and the cover 110 constitute a package. The substrate 10 and the cover 110 form a cavity 111 therebetween (refer to FIGS. 3 and 6), and the functional elements 101, 102, and 103 are contained in the cavity 111. The cavity 111 may be hermetically sealed under an inactive gas atmosphere (for example, a nitrogen gas atmosphere). The cover 110 is made of a material of, for example, silicon or glass. In the case where the cover 110 is made of the silicon material and the substrate 10 is made of the glass material, the cover 110 and the substrate 10 are joined to each other by means of, for example, anodic bonding.

The first functional element 101, the second functional element 102, and the third functional element 103 are provided on the substrate 10. In the illustrated example, the second functional element 102 is provided at one X-side of the first functional element 101 in the X-axis direction. Specifically, the second functional element 102 is provided at a negative X-axis side of the first functional element 101 in the X-axis direction. In the illustrated example, the third functional element 103 is provided at a position which is located at one X-axis side of the first functional element 101 in the X-axis direction and which is located at one Y-axis side of the second functional element 102 in the Y-axis direction. Specifically, the third functional element 103 is provided at a position which is located at a negative X-axis side of the first functional element 101 in the X-axis direction and which is located at a positive Y-axis side of the second functional element 102 in the Y-axis direction. For example, the third functional element 103 is provided, in a planar view, between the second functional element 102 and the terminals 94, 95, 96, and 97.

A width (size) W1y of the first functional element 101 in the Y-axis direction is, for example, wider (larger) than a width W1x of the first functional element 101 in the X-axis direction. A width W2x of the second functional element 102 in the X-axis direction is, for example, wider than a width W2y of the second functional element 102 in the Y-axis direction. A width W3x of the third functional element 103 in the X-axis direction is, for example, wider than a width W3y of the third functional element 103 in the Y-axis direction.

The first functional element 101 includes a first dummy electrode 70a. The second functional element 102 includes a second dummy electrode 70b. The third functional element 103 includes a third dummy electrode 70c, a fourth dummy electrode 70d, and a fifth dummy electrode 70e. In the illustrated example, the fourth dummy electrode 70d is provided at a negative X-axis side of the third dummy electrode 70c in the X-axis direction, and the fifth dummy electrode 70e is provided at a positive X-axis side of the third dummy electrode 70c in the X-axis direction.

Each of the dummy electrodes 70a, 70b, 70c, 70d, and 70e is made of a material of, for example, indium tin oxide (ITO), aluminum, gold, platinum, titanium, tungsten, or chromium.

In the case where each of the dummy electrodes 70a, 70b, 70c, 70d, and 70e is made of a transparent electrode material, such as an ITO material, and simultaneously therewith the substrate 10 is made of a transparent material, any foreign substance existing on any one of the dummy electrodes 70a, 70b, 70c, 70d, and 70e can be easily viewed from a lower face side of the substrate 10. This effect can be similarly obtained in the case where each of the wirings 81, 82, 83, 84, and 85 and the terminals 91, 92, 93, 94, 95, 96, and 97 is made of a transparent electrode material.

The first wiring 81, the second wiring 82, the third wiring 83, the fourth wiring 84, and the fifth wiring 85 are provided on the substrate 10. The first wiring 81 electrically interconnects the first dummy electrode 70a and the second dummy electrode 70b. The second wiring 82 electrically interconnects the second dummy electrode 70b and the third dummy electrode 70c. The third wiring 83 electrically interconnects the second dummy electrode 70b and the fourth dummy electrode 70d. The fourth wiring 84 electrically interconnects the first dummy electrode 70a and the fifth dummy electrode 70e.

Each of the wirings 81, 82, 83, 84, and 85 is made of the same material as that of each of the dummy electrodes 70a, 70b, 70c, 70d, and 70e. The dummy electrodes 70a, 70b, 70c, 70d, and 70e and the wirings 81, 82, 83, 84, and 85 are provided as a unified structure. For example, the dummy electrodes 70a, 70b, 70c, 70d, and 70e and the wirings 81, 82, 83, 84, and 85 are simultaneously formed through a method of patterning a single conductive layer.

The first terminal 91, the second terminal 92, the third terminal 93, the fourth terminal 94, the fifth terminal 95, the sixth terminal 96, and the seventh terminal 97 are provided on the substrate 10. The terminals 91, 92, 93, 94, 95, 96, and 97 are provided so as not to overlap the cover 11 in a planar view. In the illustrated example, the terminals 91, 92, 93, 94, 95, 96, and 97 are provided so as to be arranged in this order in the X-axis direction.

The first terminal 91 is electrically connected to the dummy electrodes 70a, 70b, 70c, 70d, and 70e. In the illustrated example, the dummy electrodes 70a, 70b, 70c, 70d, and 70e are electrically interconnected by the wirings 81, 82, 83, and 84. Further, the fifth wiring 85 electrically interconnects the first dummy electrode 70a and the first terminal 91. As a result, the first terminal 91 is electrically connected to the dummy electrodes 70a, 70b, 70c, 70d, and 70e. The terminals 92 and 93 are electrically connected to, for example, the first functional element 102 via wirings which are not illustrated (details of this configuration being described below). The terminals 94 and 95 are electrically connected to, for example, the third functional element 103 via wirings which are not illustrated (details of this configuration being described below). The terminals 96 and 97 are electrically connected to, for example, the second functional element 102 via wirings which are not illustrated (details of this configuration being described below). The terminals 91, 92, 93, 94, 95, 96, and 97 are portions each of which is electrically connected to, for example, an external circuit or an element. Each of the terminals 91, 92, 93, 94, 95, 96, and 97 is made of, for example, the same material as that of each of the dummy electrodes 70a, 70b, 70c, 70d, and 70e.

Hereinafter, the first functional element 101, the second functional element 102, and the third functional element 103 will be described in detail.

1.1 First Functional Element

Figure 2:
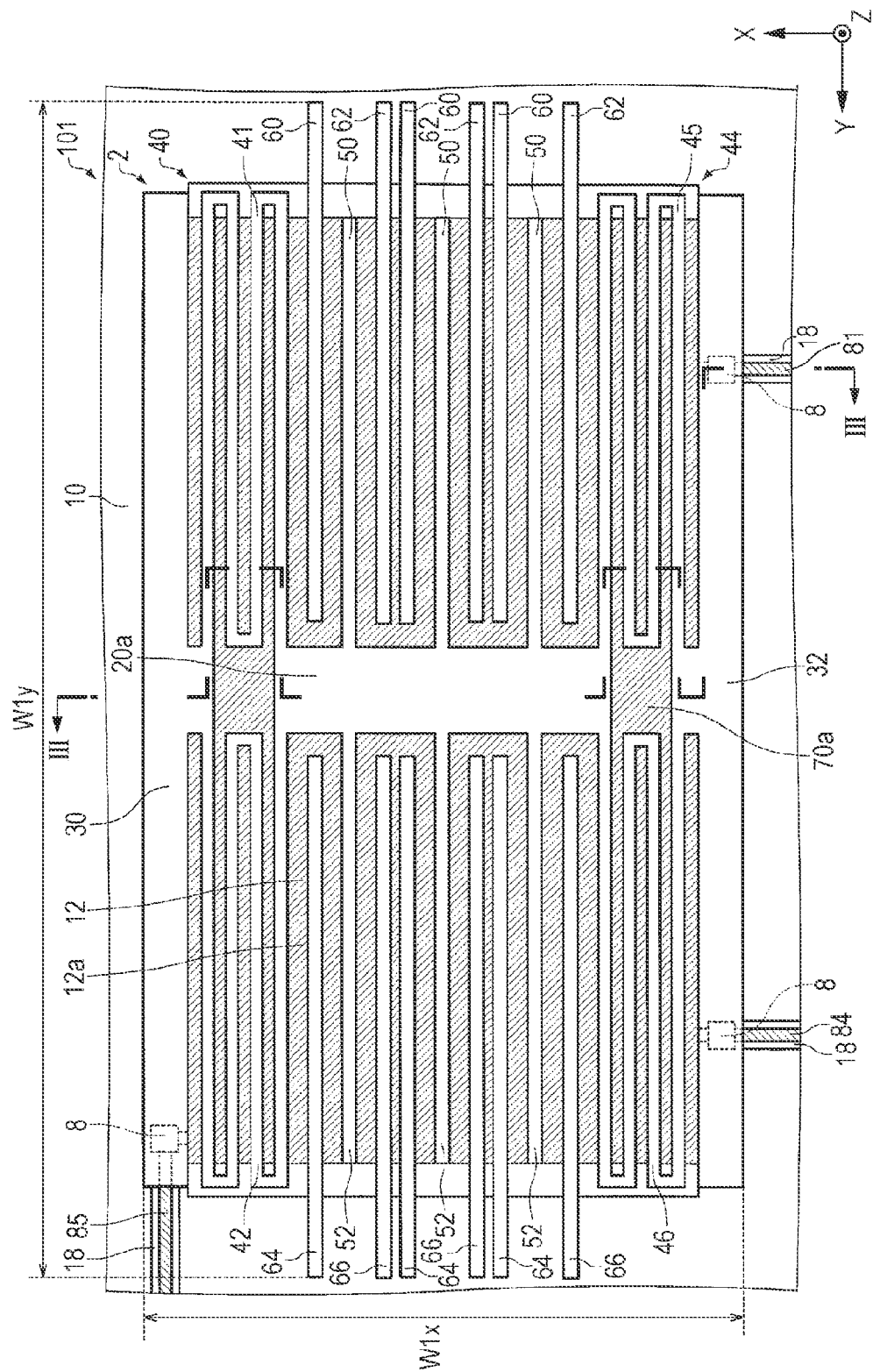
FIG. 2 is a plan view schematically illustrating a first functional device included in an electronic device according to an embodiment.
Figure 3:
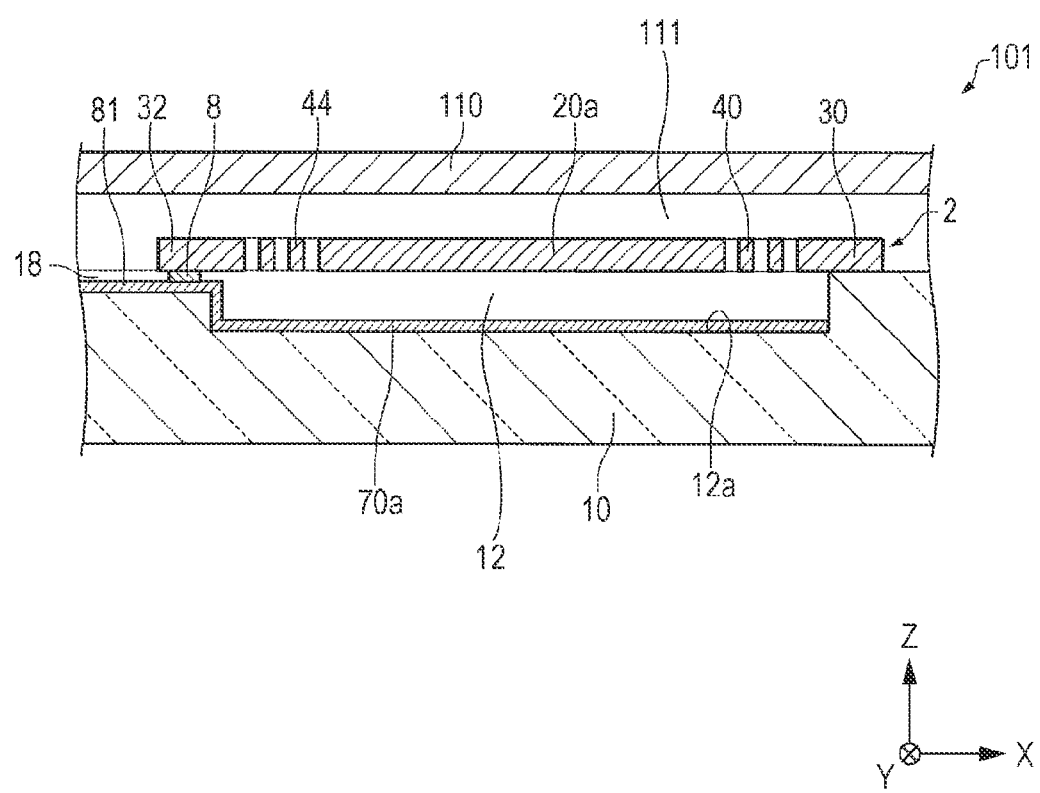
FIG. 3 is a cross-sectional view schematically illustrating a first functional device included in an electronic device according to an embodiment.

First, the first functional element 101 will be described. FIG. 2 is a plan view schematically illustrating the first functional element 101. FIG. 3 is a cross-sectional view, schematically illustrating the first functional element 101, and being taken along the line III-III of FIG. 2. In addition, in FIG. 2, the cover 110 is omitted from illustration for the sake of convenience.

As shown in FIGS. 2 and 3, the first functional element 101 includes a first movable element 20a; fixed portions 30 and 32; elastic portions 40 and 44; movable electrode portions 50 and 52; fixed electrode portions 60, 62, 64, and 66; and the first dummy electrode 70a.

The first movable element 20a, the fixed portions 30 and 32, the elastic portions 40 and 44, and the movable electrode portions 50 and 52 are provided above a concave portion 12 which is formed in the substrate 10. In the example shown in FIG. 2, the planar shape (a shape viewed in the Z-axis direction) of the concave portion 12 is a rectangular shape. The first movable element 20a can move without contacting with the substrate 10 because of the existence of the concave portion 12. In addition, although, in the example shown in FIG. 2, side faces of the substrate 10 which define the concave portion 12 are perpendicular to the upper face of the substrate 10, the side faces of the substrate 10 which define the concave portion 12 may be inclined to the upper face of the substrate 10.

The first movable element 20a, the fixed portions 30 and 32, the elastic portions 40 and 44, and the movable electrode portions 50 and 52 are provided as a unified structure. The first movable element 20a, the fixed portions 30 and 32, the elastic portions 40 and 44, and the movable electrode portions 50 and 52 are formed as a unified structure through a method of patterning, for example, a single substrate (a silicon substrate 6 (refer to FIG. 8)). Thus, the first movable element 20a, the fixed portions 30 and 32, the elastic portions 40 and 44, and the movable electrode portions 50 and 52 constitute a single structural element (a silicon structural element) 2. The material of the structural element 2 is a silicon material having electric conductivity resulting from doping with impurities, such as a phosphorous material and a boron material.

The first movable element 20a is movable in the X-axis direction. Specifically, the first movable element 20a moves in the X-axis direction in accordance with acceleration in the X-axis direction while elastically deforming the elastic portions 40 and 44. Further, such a movement of the first movable element 20a varies distances between the movable electrode portions 50 and the fixed electrode portions 60 and distances between the movable electrode portions 50 and the fixed electrode portions 62, as well as distances between the movable electrode portions 52 and the fixed electrode portions 64 and distances between the movable electrode portions 52 and the fixed electrode portions 66. That is, such a movement of the first movable element 20a varies capacitances between the movable electrode portions 50 and the fixed electrode portions 60 and capacitances between the movable electrode portions 50 and the fixed electrode portions 62, as well as capacitances between the movable electrode portions 52 and the fixed electrode portions 64 and capacitances between the movable electrode portions 52 and the fixed electrode portions 66. The first functional element 101 detects the acceleration in the X-axis direction on the basis of these capacitances. In the example shown in FIG. 1, the planer shape of the first movable element 20a is a rectangular shape having long sides each extending along the X-axis.

The first fixed portion 30 and the second fixed portion 32 are fixed to the substrate 10 by being joined thereto. The first fixed portion 30 is located at a positive X-axis side of the concave portion 12 in the X-axis direction in a planar view (when viewed in the Z-axis direction). The second fixed portion 32 is located at a negative X-axis side of the concave portion 12 in the X-axis direction in the planar view. Each of the fixed portions 30 and 32 is provided across one of outer edges of the concave portion 12. In the case where the substrate 10 is made of a glass material and each of the fixed portions 30 and 32 is made of a silicon material, the substrate 10 is joined to the fixed portions 30 and 32 (i.e., the structural element 2) by means of, for example, anodic bonding.

The first elastic portion 40 interconnects the first movable element 20a and the first fixed portion 30. The second elastic portion 44 interconnects the first movable element 20a and the second fixed portion 32. Each of the elastic portions 40 and 44 has a predetermined spring contact and is structured so as to enable the first movable element 20a to move in the X-axis direction. In the illustrated example, the first elastic portion 40 is constituted by beams 41 and 42 each forming a shape which extends in the X-axis direction while reciprocating in the Y-axis direction. The second elastic portion 44 is constituted by beams 45 and 46 each forming a shape which extends in the X-axis direction while reciprocating in the Y-axis direction.

The first movable electrode portion 50 and the second movable electrode portion 52 each extend from the first movable element 20a in a corresponding one of mutually opposite directions along the Y-axis. Specifically, the first movable electrode portion 50 extends from the first movable element 20a toward a negative Y-axis side in the Y-axis direction. The second movable electrode portion 52 extends from the first movable element 20a toward a positive Y-axis side in the Y-axis direction. A plurality of the first movable electrode portions 50 are arranged in the X-axis direction and a plurality of the second movable electrode portions 52 are arranged in the X-axis direction. In the illustrated example, the planar shape of each of the first movable electrode portions 50 as well as the planar shape of each of the second movable electrode portions 52 is a rectangular shape having long sides each extending along the Y-axis. Each of the first movable electrode portions 50 as well as each of the second movable electrode portions 52 is movable along the X-axis in conjunction with the movement of the first movable element 20a.

Each of the first fixed electrode portions 60 as well as each of the second fixed electrode portions 62 is provided so as to face a corresponding one of the first movable electrode portions 50. Specifically, each of the first fixed electrode portions 60 is provided at one of mutually opposite sides of a corresponding one of the first movable electrodes 50 (i.e., at a positive X-axis side of a corresponding one of the first movable electrodes 50 in the X-axis direction) so as to face the corresponding one of the first movable electrodes 50. Each of the second fixed electrode portions 62 is provided at the other one of the mutually opposite sides of a corresponding one of the first movable electrodes 50 (i.e., at a negative X-axis side of a corresponding one of the first movable electrodes 50 in the X-axis direction) so as to face the corresponding one of the first movable electrodes 50. The first fixed electrode portions 60 as well as the second fixed electrode portions 62 are fixed to the substrate 10. The planar shape of each of the first fixed electrode portions 60 as well as the planar shape of each of the second fixed electrode portions 62 is a rectangular shape having long sides each extending along the Y-axis. The material of each of the first fixed electrode portions 60 as well as the material of each of the second fixed electrode portions 62 is the same as that of the first movable element 20a.

Each of the third fixed electrode portion 64 as well as each of the fourth fixed electrode portions 66 is provided so as to face a corresponding one of the second movable electrode portions 52. Specifically, each of the third fixed electrode portions 64 is provided at one of mutually opposite sides of a corresponding one of the second movable electrodes 52 (i.e., at a positive X-axis side of a corresponding one of the second movable electrodes 52 in the X-axis direction) so as to face the corresponding one of the second movable electrodes 52. Each of the fourth fixed electrode portions 66 is provided at the other one of the mutually opposite sides of a corresponding one of the second movable electrodes 52 (i.e., at a negative X-axis side of a corresponding one of the second movable electrodes 52 in the X-axis direction) so as to face the corresponding one of the second movable electrodes 52. The third fixed electrode portions 64 as well as the fourth fixed electrode portions 66 are fixed to the substrate 10. The planar shape of each of the third fixed electrode portions 64 as well as the planar shape of each of the fourth fixed electrode portions 66 is a rectangular shape having long sides each extending along the Y-axis. The material of each of the third fixed electrode portions 64 as well as the material of each of the fourth fixed electrode portions 66 is the same as that of the first movable element 20a.

The first dummy electrode 70a is provided on the substrate 10. The first dummy electrode 70a is provided on a face which is a bottom face 12a of the concave portion 12, and which is part of the upper face of the substrate 10 and defines the concave portion 12. The first dummy electrode 70a is disposed so as to face the first movable element 20a, the elastic portions 40 and 44, the movable electrode portions 50 and 52, and the fixed electrodes 60, 62, 64, and 66. That is, the first dummy electrode 70a overlaps, in a planar view, the first movable element 20a, the elastic portions 40 and 44, the movable electrode portions 50 and 52, and the fixed electrodes 60, 62, 64, and 66.

The first dummy electrode 70a is electrically connected to the wirings 81, 84, and 85. In the illustrated example, the wirings 81, 84, and 85 are each provided in a corresponding one of the groove portions 18 formed in the substrate 10. The first dummy electrode 70a is electrically connected to the first movable element 20a. In the illustrated example, each of the wirings 81 and 84 is electrically connected to the second fixed portion 32 via a corresponding one of two contact portions 8. Thus, the first dummy electrode 70a is electrically connected to the first movable element 20a via the wirings 81 and 84, the two contact portions 8, the second fixed portion 32, and the second elastic portion 44. Moreover, in the illustrated example, the fifth wiring 85 is electrically connected to the fixed portion 30 via a contact portion 8. Thus, the first dummy electrode 70a is electrically connected to the first movable element 20a via the fifth wiring 85, the contact portion 8, the first fixed portion 30, and the first elastic portion 40.

The first dummy electrode 70a is electrically connected to the first terminal 91 via the fifth wiring 85. Thus, the first movable element 20a is electrically connected to the first terminal 91.

The first dummy electrode 70a reduces electrostatic forces which arise between the first movable element 20a (the structural element 2) and the substrate 10, thereby enabling reduction of the degree of adherence of the structural element 2 to the substrate 10. Accordingly, it is possible to, for example, when manufacturing the electronic device 100, prevent the occurrence of a problem in that the structural element 2 is pulled toward the side of the substrate 10 by the electrostatic forces which are caused by an electric potential difference arising between the structural element 2 and the substrate 10 and, as a result, the structural element 2 is adhered to the substrate 10. Similarly, the first dummy electrode 70a reduces electrostatic forces which arise between the bottom face 12a and the fixed electrodes 60, 62, 64, and 66, thereby enabling reduction of the degree of adherence of the fixed electrodes 60, 62, 64, and 66 to the bottom face 12a. Accordingly, it is possible to, for example, when manufacturing the electronic device 100, prevent the occurrence of a problem in that the fixed electrodes 60, 62, 64, and 66 are pulled toward the side of the bottom face 12a by the electrostatic forces which are caused by an electric potential difference arising between the bottom face 12a and the fixed electrodes 60, 62, 64, and 66 and, as a result, the fixed electrodes 60, 62, 64, and 66 are adhered to the bottom face 12a.

In the first functional element 101, the first fixed electrode portions 60 are electrically connected to the third fixed electrodes 64 via wirings (not illustrated), and these wirings are electrically connected to, for example, the second terminal 92. The second fixed electrode portions 62 are electrically connected to the fourth fixed electrodes 66 via wirings (not illustrated), and these wirings are electrically connected to, for example, the third terminal 93.

For the first functional element 101, it is possible to measure a sum of capacitances between the first movable electrode portions 50 and the first fixed electrode portions 60 and capacitances between the second movable electrode portions 52 and the third fixed electrode portions 64 by using, for example, the terminals 91 and 92. Moreover, for the first functional element 101, it is possible to measure a sum of capacitances between the first movable electrode portions 50 and the second fixed electrode portions 62 and capacitances between the second movable electrode portions 52 and the fourth fixed electrode portions 66 by using, for example, the terminals 91 and 93. Further, for the first functional element 101, it is possible to detect the acceleration by separately measuring the two kinds of capacitances: one being the sum of capacitances between the first movable electrode portions 50 and the first fixed electrode portions 60 and capacitances between the second movable electrode portions 52 and the third fixed electrode portions 64; the other one being the sum of capacitances between the first movable electrode portions 50 and the second fixed electrode portions 62 and capacitances between the second movable electrode portions 52 and the fourth fixed electrode portions 66, in such manners described above, and performing differential detection between the measured two kinds of capacitances (i.e., through the use of a so-called differential detection method).

In addition, as shown in FIG. 2, the width W1x of the first functional element 101 in the X-axis direction is, for example, a distance between a positive X-axis side edge of the first fixed portion 30 in the X-axis direction and a negative X-axis side edge of the second fixed portion 32 in the X-axis direction. The width W1y of the first functional element 101 in the Y-axis direction is, for example, a distance between a negative Y-axis side edge of the first fixed electrode portion 60 in the Y-axis direction and a positive Y-axis side edge of the third fixed electrode portion 64 in the Y-axis direction.

1.2 Second Functional Element

Figure 4:
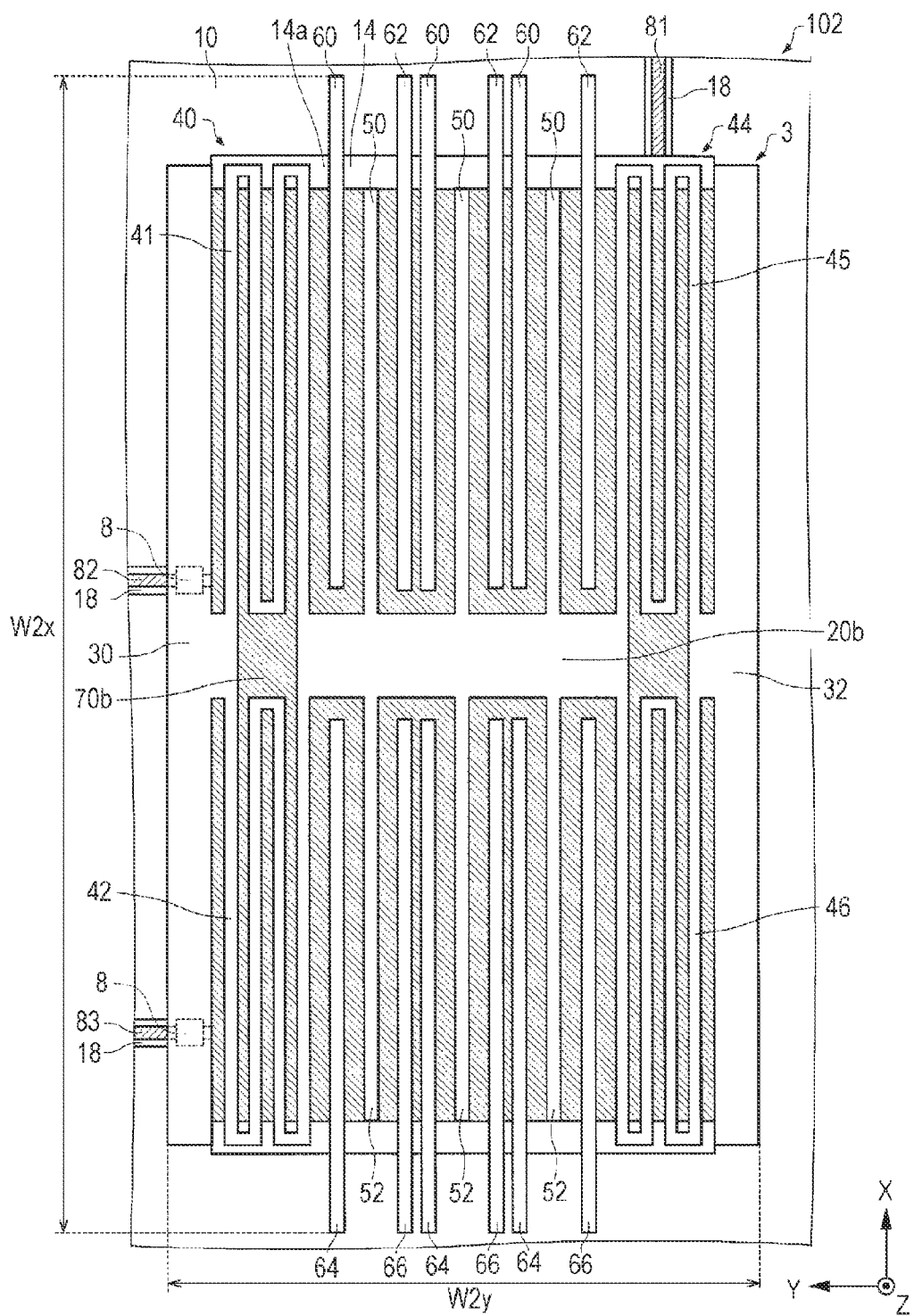
FIG. 4 is a plan view schematically illustrating a second functional element included in an electronic device according to an embodiment.

Next, the second functional element 102 will be described. FIG. 4 is a plan view schematically illustrating the second functional element 102. In addition, in FIG. 4, the cover 110 is omitted from illustration for the sake of convenience.

As shown in FIG. 4, the second functional element 102 includes a second movable element 20b; fixed portions 30 and 32; elastic portions 40 and 44; movable electrode portions 50 and 52; fixed electrode portions 60, 62, 64, and 66; and the second dummy electrode 70b.

The second functional element 102 has a shape resulting from rotating the first functional element 101 by 90 degrees around an axis parallel to the Z-axis.

The second movable element 20b, the fixed portions 30 and 32, the elastic portions 40 and 44, and the movable electrode portions 50 and 52 are provided above a concave portion 14 which is formed in the substrate 10. In the illustrated example in FIG. 2, the planar shape of the concave portion 14 is a rectangular shape. The second movable element 20b can move without contacting with the substrate 10 because of the existence of the concave portion 14.

The second movable element 20b, the fixed portions 30 and 32, the elastic portions 40 and 44, and the movable electrode portions 50 and 52 are provided as a unified structure. The second movable element 20b, the fixed portions 30 and 32, the elastic portions 40 and 44, and the movable electrode portions 50 and 52 are formed as a unified structure through a method of patterning, for example, a single substrate (a silicon substrate 6 (refer to FIG. 8)). Thus, the second movable element 20b, the fixed portions 30 and 32, the elastic portions 40 and 44, and the movable electrode portions 50 and 52 form a single structural element (a silicon structural element) 3. The material of the structural element 3 is a silicon material having electric conductivity resulting from doping with impurities, such as a phosphorous material and a boron material.

The second movable element 20b is movable in the Y-axis direction. Specifically, the second movable element 20b moves in the Y-axis direction in accordance with acceleration in the Y-axis direction while elastically deforming the elastic portions 40 and 44. Further, such a movement of the second movable element 20b varies distances between the movable electrode portions 50 and the fixed electrode portions 60 and distances between the movable electrode portions 50 and the fixed electrode portions 62, as well as distances between the movable electrode portions 52 and the fixed electrode portions 64 and distances between the movable electrode portions 52 and the fixed electrode portions 66. That is, such a movement of the second movable element 20a varies capacitances between the movable electrode portions 50 and the fixed electrode portions 60 and capacitances between the movable electrode portions 50 and the fixed electrode portions 62, as well as capacitances between the movable electrode portions 52 and the fixed electrode portions 64 and capacitances between the movable electrode portions 52 and the fixed electrode portions 66. The second functional element 102 detects the acceleration in the Y-axis direction on the basis of these capacitances.

The second dummy electrode 70b is provided on the substrate 10. The second dummy electrode 70b is provided on a face which is a bottom face 14a of the concave portion 14, and which is part of the upper face of the substrate 10 and defines the concave portion 14. The second dummy electrode 70b is disposed so as to face the second movable element 20b, the elastic portions 40 and 44, the movable electrode portions 50 and 52, and the fixed electrodes 60, 62, 64, and 66. That is, the second dummy electrode 70b overlaps, in a planar view, the second movable element 20b, the elastic portions 40 and 44, the movable electrode portions 50 and 52, and the fixed electrodes 60, 62, 64, and 66.

The second dummy electrode 70b is electrically connected to the wirings 81, 82, and 83. In the illustrated example, the wirings 81, 82, and 83 are each provided in a corresponding one of the groove portions 18 formed in the substrate 10. The second dummy electrode 70b is electrically connected to the second movable element 20b. In the illustrated example, each of the wirings 82 and 83 is electrically connected to the first fixed portion 30 via a corresponding one of two contact portions 8. Thus, the second dummy electrode 70b is electrically connected to the second movable element 20b via the wirings 82 and 83, the two contact portions 8, the first fixed portion 30, and the first elastic portion 40.

As shown in FIG. 1, the second dummy electrode 70b is electrically connected to the first terminal 91 via the first wiring 81, the first dummy electrode 70a, and the fifth wiring 85. Thus, the second movable element 20b is electrically connected to the first terminal 91.

The second dummy electrode 70b reduces electrostatic forces which arise between the second movable element 20b (the structural element 3) and the substrate 10, thereby enabling reduction of the degree of adherence of the structural element 3 to the substrate 10. Accordingly, it is possible to, for example, when manufacturing the electronic device 100, prevent the occurrence of a problem in that the structural element 3 is pulled toward the side of the substrate 10 the electrostatic forces which are caused by an electric potential difference arising between the structural element 3 and the substrate 10 and, as a result, the structural element 3 is adhered to the substrate 10. Similarly, the second dummy electrode 70b reduces electrostatic forces which arise between the bottom face 14a and the fixed electrodes 60, 62, 64, and 66, thereby enabling reduction of the degree of adherence of the fixed electrodes 60, 62, 64, and 66 to the bottom face 14a. Accordingly, it is possible to, for example, when manufacturing the electronic device 100, prevent the occurrence of a problem in that the fixed electrodes 60, 62, 64, and 66 are pulled toward the side of the bottom face 14a by the electrostatic forces which are caused by an electric potential difference arising between the bottom face 14a and the fixed electrodes 60, 62, 64, and 66 and, as a result, the fixed electrodes 60, 62, 64, and 66 are adhered to the bottom face 14a.

In the second functional element 102, the first fixed electrode portions 60 are electrically connected to the third fixed electrodes 64 via wirings (not illustrated), and these wirings are electrically connected to, for example, the sixth terminal 96. The second fixed electrode portions 62 are electrically connected to the fourth fixed electrode portions 66 via wirings (not illustrated), and these wirings are electrically connected to, for example, the seventh terminal 97.

For the second functional element 102, it is possible to measure a sum of capacitances between the first movable electrode portions 50 and the first fixed electrode portions 60 and capacitances between the second movable electrode portions 52 and the third fixed electrode portions 64 by using, for example, the terminals 91 and 96. Moreover, for the second functional element 102, it is possible to measure a sum of capacitances between the first movable electrode portions 50 and the second fixed electrode portions 62 and capacitances between the second movable electrode portions 52 and the fourth fixed electrode portions 66 by using, for example, the terminals 91 and 97. Further, for the second functional element 102, it is possible to detect the acceleration by separately measuring the two kinds of capacitances: one being the sum of capacitances between the first movable electrode portions 50 and the first fixed electrode portions 60 and capacitances between the second movable electrode portions 52 and the third fixed electrode portions 64; the other one being the sum of capacitances between the first movable electrode portions 50 and the second fixed electrode portions 62 and capacitances between the second movable electrode portions 52 and the fourth fixed electrode portions 66, in such manners described above, and performing differential detection between the measured two kinds of capacitances (through the use of a so-called differential detection method).

In addition, as shown in FIG. 4, the width $W2x$ of the second functional element 102 in the X-axis direction is, for example, a distance between a positive X-axis side edge of the first fixed electrode portion 60 in the X-axis direction and a negative X-axis side edge of the third fixed electrode portion 64 in the X-axis direction. The width $W2y$ of the second functional element 102 in the Y-axis direction is, for example, a distance between a positive Y-axis side edge of the first fixed portion 30 in the Y-axis direction and a negative Y-axis side edge of the second fixed portion 32 in the Y-axis direction.

1.3 Third Functional Element

Figure 5:
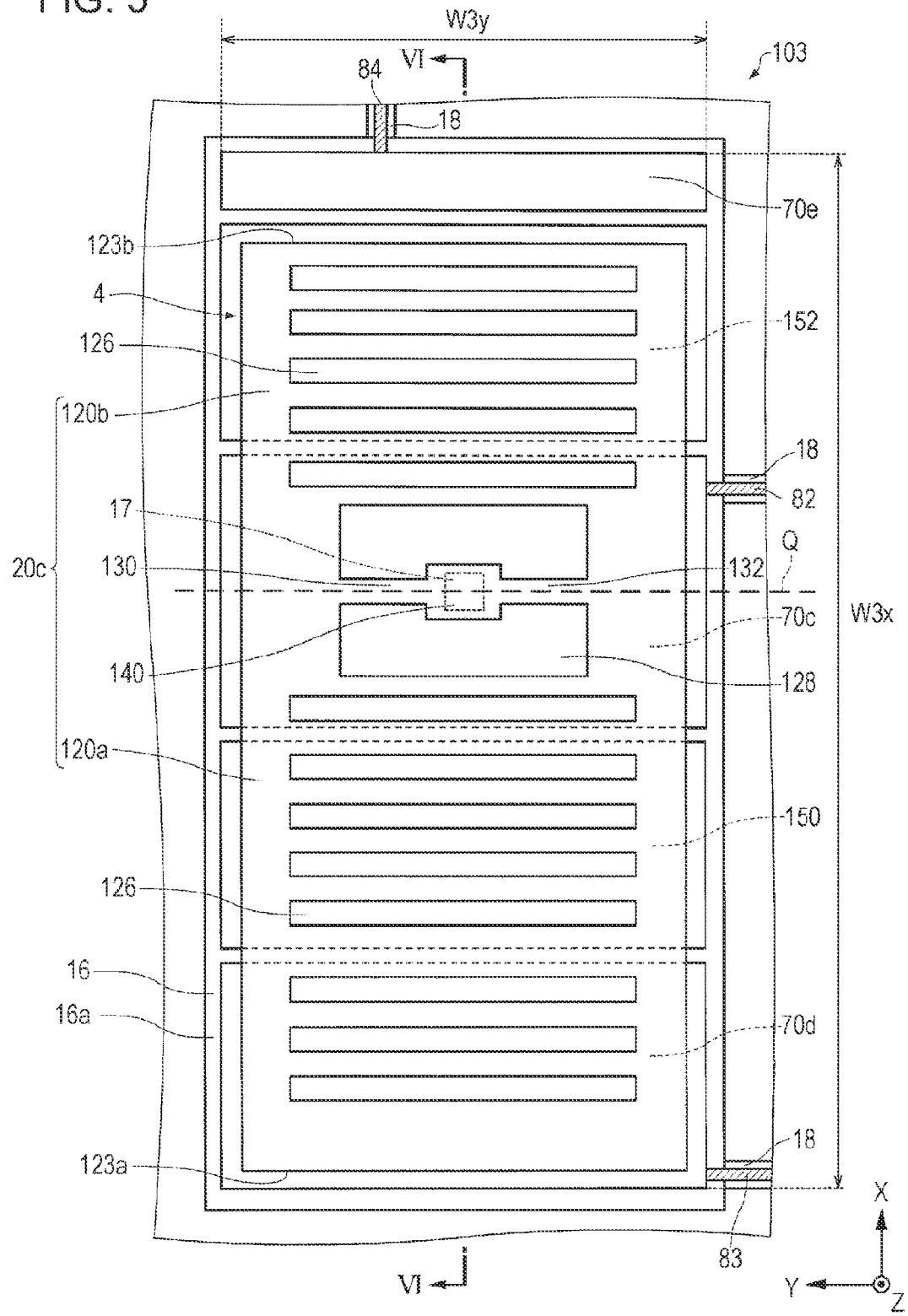
FIG. 5 is a plan view schematically illustrating a third functional element included in an electronic device according to an embodiment.
Figure 6:
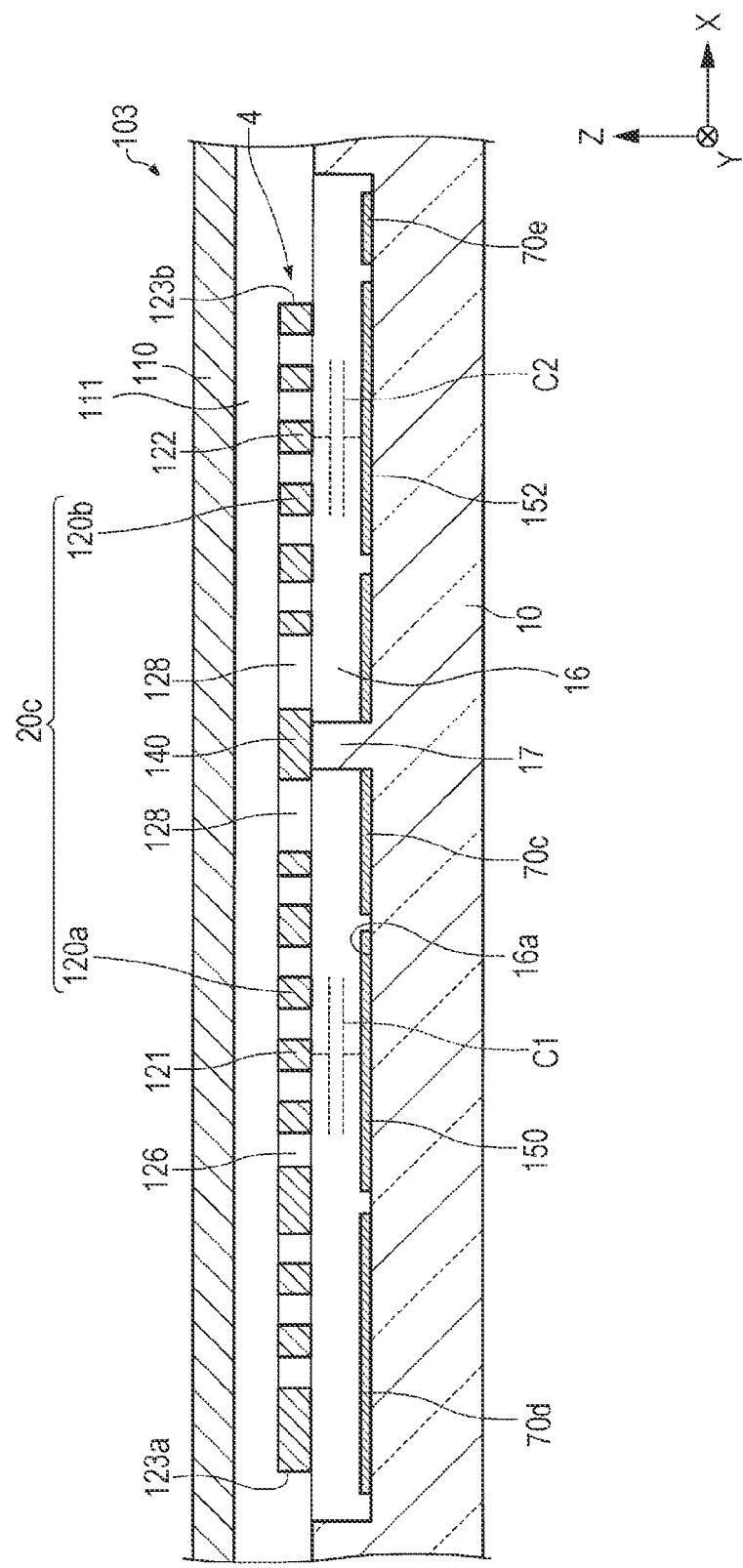
FIG. 6 is a cross-sectional view schematically illustrating a third functional element included in an electronic device according to an embodiment.

Next, the third functional element 103 will be described. FIG. 5 is a plan view schematically illustrating the third functional element 103. FIG. 6 is a cross-sectional view, schematically illustrating the third functional element 103, and being taken along the line VI-VI of FIG. 5. In addition, in FIG. 5, the cover 110 is omitted from illustration for the sake of convenience.

As shown in FIGS. 5 and 6, the third functional element 103 includes a third movable element 20c; supporting portions 130 and 132; a fixing portion 140; fixed electrode portions 150 and 152; and dummy electrodes 70c, 70d, and 70e.

The third movable element 20c is provided above a concave portion 16 which is formed in the substrate 10. In the illustrated example in FIG. 2, the planar shape of the concave portion 16 is a rectangular shape. There is provided a post portion 17 on a bottom face 16a of the concave portion 16, the bottom face 16a being a face which is formed on the upper face of the substrate 10 and which defines the concave portion 16. The post portion 17 projects from the bottom face 16a in an upward direction (i.e., toward a positive Z-axis side in the Z-axis direction). The height of the post portion 17 and the depth of the concave portion 16 are, for example, equal to each other. The third movable element 20c can move without contacting with the substrate 10 because of the existence of the concave portion 16. The third movable element 20c is connected to the fixing portion 140, which is fixed to the substrate 10, via the supporting portions 130 and 132.

The third movable element 20c can swing about a supporting axis Q. Specifically, when subjected to acceleration in a vertical direction (in the Z-axis direction), the third movable element 20c moves in the Z-axis direction. That is, the third movable element 20c swings like a seesaw about the supporting axis Q which functions as a rotation axis (a swinging axis) and which is determined by the supporting portions 130 and 132. In this manner, the third movable element 20c is capable of moving in the Z-axis direction. In the illustrated example, the supporting axis Q is parallel to the Y-axis. The planar shape of the third movable element 20c is, for example, a rectangular shape. The thickness of the movable element 20 (i.e., the size of the movable element 20 in the Z-axis direction) is, for example, constant.

The third movable element 20c includes a first seesaw piece (a first portion) 120a and a second seesaw piece (a second portion) 120b. The first seesaw piece 120a is, in a planar view, one of two portions which constitute the third movable element 20c and which are partitioned by the supporting axis Q. That is, in the illustrated example, the first seesaw piece 120a is, in a planar view, a portion located at a negative X-axis side of the supporting axis Q in the X-axis direction. The second seesaw piece 120b is, in a planar view, the other one of the two portions which constitute the third movable element 20c and which are partitioned by the supporting axis Q. That is, in the illustrated example, the second seesaw piece 120b is, in a planar view, a portion located at a positive X-axis side of the supporting axis Q in the X-axis direction. That is, the third movable element 20c is partitioned into the first seesaw piece 120a and the second seesaw piece 120b along the supporting axis Q which is a boundary therebetween.

For example, when acceleration in a vertical direction (for example, gravitational acceleration) is applied to the third movable element 20c, a moment of rotation (a moment of force) arises on each of the first seesaw piece 120a and the second seesaw piece 120b. Here, in the case where the moment of rotation arising on the first seesaw piece (for example, a counterclockwise moment of rotation) and the moment of rotation arising on the second seesaw piece (for example, a clockwise moment of rotation) are balanced with each other, any change does not occur in the inclination of the third movable element 20c and, as a result, it is difficult to detect the acceleration. Thus, the third movable element 20c is designed such that, when the acceleration in the vertical direction is applied to the third movable element 20c, the moment of rotation arising on the first seesaw piece and the moment of rotation arising on the second seesaw piece are not balanced with each other and the third movable element 20c is inclined by a certain angle.

In the third functional element 103, through a method of causing the mass of the first seesaw piece 120a and the mass of the second seesaw piece 120b to be mutually different, when the acceleration in the vertical direction is applied to the third functional element 103, the moment of rotation arising on the first seesaw piece and the moment of rotation arising on the second seesaw piece are caused to be mutually unbalanced, thereby causing the third movable element 20c to be inclined by a certain angle. That is, in the third functional element 103, the supporting axis Q is disposed at a position distanced from the center of gravity of the third movable element 20c. In the illustrated example, in a planar view, a distance between an edge face 123a of the first seesaw piece 120a and the supporting axis Q is made larger than a distance between an edge face 123b of the second seesaw piece 120b and the supporting axis Q, and further, the thickness of the first seesaw piece 120a is made equal to the thickness of the first seesaw piece 120b. In this manner, the mass of the first seesaw piece 120a is made larger than the mass of the second seesaw piece 120b, thereby causing the mass of the first seesaw piece 120a to be different from the mass of the second seesaw piece 120b.

In addition, although not illustrated, in a planar view, the mass of the first seesaw piece 120a and the mass of the second seesaw piece 120b may be made mutually different through a method of causing the distance between the edge face 123a of the first seesaw piece 120a and the supporting axis Q to be equal to the distance between the edge face 123b of the second seesaw piece 120b and the supporting axis Q, and further, causing the thickness of the first seesaw piece 120a to be different from the thickness of the second seesaw piece 120b. In such a case, when the acceleration in the vertical direction is applied to the third movable element 20c, it is also possible to cause the third movable element 20c to be inclined by a certain angle.

The third movable element 20c includes a first movable electrode portion 121 and a second movable electrode portion 122 which are provided so as to be partitioned by the supporting axis Q which is a boundary therebetween. The first movable electrode portion 121 is provided in the first seesaw piece 120a. The second movable electrode portion 122 is provided in the second seesaw piece 120b.

The first movable electrode portion 121 is, in a planer view, a portion constituting the third movable element 20c and overlapping a first fixed electrode portion 150. The second movable electrode portion 122 is, in a planer view, a portion constituting the third movable element 20c and overlapping a second fixed electrode portion 152. In the third functional element 103, the movable electrode portions 121 and 122 are provided through a method of forming the third movable element 20c by using a conductive material (a silicon material resulting from doping with impurities). That is, the first seesaw piece 120a functions as the first movable electrode portion 121, and the second seesaw piece 120b functions as the second movable electrode portion 122. A certain electric potential is supplied to the first movable electrode portion 121 and the second movable electrode portion 122 (i.e., the third movable element 20c).

In the third movable element 20c, there are provided a plurality of slit portions 126 each penetrating through the movable element 20c. The slot portions 126 are provided in both of the first seesaw piece 120a and the second seesaw piece 120b. In the illustrated example, the planar view of each of the slit portions 126 is a rectangular shape having long sides each extending along the Y-axis. Through the method of providing the slit portions 126 in the third movable element 20c, it is possible to reduce the degree of damping caused by the viscosity of gas (the damping being an action that operates so as to block a movement of a mass entity, that is, flow resistance).

The third movable element 20c includes a penetrating hole 128 in which the supporting portions 130 and 132 and the fixing portion 140 are provided.

The supporting portions 130 and 132 support the third movable element 20c such that the third movable element 20c can swing about the supporting axis Q. Each of the supporting portions 130 and 132 functions as a torsion spring. Thus, the third movable element 20c can be given strong restoring forces against torsional deformations which occur in the supporting portions 130 and 132 and which are caused by a seesaw-like swinging movement of the third movable element 20c.

The supporting portions 130 and 132 are disposed on the supporting axis Q in a planar view. Each of the supporting portions 130 and 132 extends along the supporting axis Q. The supporting portion 130 extends from the fixing portion 140 up to the third movable element 20c toward a positive Y-axis side in the Y-axis direction. The supporting axis 132 extends from the fixing portion 140 up to the third movable element 20c toward a negative Y-axis side in the Y-axis direction. Each of the supporting portions 130 and 132 interconnects the fixing portion 140 and the third movable element 20c.

The fixing portion 140 is disposed in the penetrating hole 128. The fixing portion 140 is provided on the supporting axis Q in a planar view. The fixing portion 140 is joined to the post portion 17 of the substrate 10.

The third movable element 20c, the supporting portions 130 and 132, and the fixing portion 140 are provided as a unified structure. The third movable element 20c and the supporting portions 130 and 132, and the fixing portion 140 are provided as a unified structure through a method of patterning, for example, a single substrate (a silicon substrate 6 (refer to FIG. 8)). Thus, the third movable element 20c and the supporting portions 130 and 132, and the fixing portion 140 constitute a single structural element (silicon structural element) 4. The material of the structural element 4 is, for example, a silicon material having electric conductivity resulting from doping with impurities, such as a phosphorous material and a boron material. In the case where the substrate 10 is made of a glass material and the structural element 3 is made of a silicon material, the substrate 10 and the fixing portion 140 (the structural element 4) are joined to each other by means of, for example, anodic bonding.

The structural element 4 is fixed to the substrate 10 through the single fixing portion 140. That is, the structural element 4 is supported on the substrate through a single point. Accordingly, as compared with a case where, for example, the structural element 4 is supported on the substrate 10 through two points (i.e., a case where the structural element 4 is supported on the substrate 10 through two fixing portions), influences exerted on the supporting portions 130 and 132 by various stresses, such as a stress which arises due to a difference in a coefficient of thermal expansion between the substrate 10 and the structural element 4, and a stress applied to the electronic device when the electronic device is installed, can be reduced to a greater degree.

The first fixed electrode portion 150 is provided on the substrate 10. The first fixed electrode portion 150 is provided on the bottom face 16a of the concave portion 16. The first fixed electrode portion 150 is disposed so as to face the first seesaw piece 120a (the first movable electrode portion 121). That is, the first fixed electrode portion 150 overlaps the first seesaw piece 120a (the first movable electrode portion 121) in a planar view. There is provided a gap between the first fixed electrode portion 150 and the first seesaw piece 120a (the first movable electrode portion 121). The first fixed electrode portion 150 is electrically connected to, for example, the fifth terminal 95 via wirings (not illustrated).

The second fixed electrode portion 152 is provided on the substrate 10. The second fixed electrode portion 152 is provided on the bottom face 16a of the concave portion 16. The third dummy electrode 70c is provided between the first fixed electrode portion 150 and the second fixed electrode portion 152. The second fixed electrode portion 152 is disposed so as to face the second seesaw piece 120b (the second movable electrode portion 122). That is, the second fixed electrode portion 152 overlaps the second seesaw piece 120b (the second movable electrode portion 122) in a planar view. There is provided a gap between the second fixed electrode portion 152 and the second seesaw piece 120b (the second movable electrode portion 122). The second fixed electrode portion 152 is electrically connected to, for example, the fourth terminal 94 via wirings (not illustrated).

In the third functional element 103, for example, the shape of a portion in which the first fixed electrode portion 150 overlaps the third movable portion 20c in a planar view is symmetric with the shape of a portion in which the second fixed electrode portion 152 overlaps the third movable portion 20c in a planar view. That is, an area of the portion in which the first fixed electrode portion 150 overlaps the third movable portion 20c in a planar view is equal to an area of the portion in which the second fixed electrode portion 152 overlaps the third movable portion 20c in a planar view.

The first fixed electrode portion 150 and the first movable electrode portion 121 form a capacitance C1 therebetween. Further, the second fixed electrode portion 152 and the second movable electrode portion 122 form a capacitance C2 therebetween. The capacitance C1 and the capacitance C2 are configured so as to be equal to each other when the third movable element 20c is, for example, in a horizontal state, as shown in FIG. 6. The positions of the movable electrode portions 121 and 122 vary in accordance with the movement of the third movable element 20c, and the capacitance C1 and the capacitance C2 vary in accordance with the position of the movable electrode portion 121 and the position of the movable electrode portion 122, respectively.

The third dummy electrode 70c is provided on the substrate 10. The third dummy electrode 70c is provided on the bottom face 16a of the concave portion 16a. The third dummy electrode 70c is provided between the first fixed electrode portion 150 and the second fixed electrode portion 152. The third dummy electrode 70c is disposed so as to face a portion of the first seesaw piece 120a, a portion of the second seesaw piece 120b, and the supporting portions 130 and 132. That is, the third dummy electrode 70c overlaps, in a planar view, the portion of the first seesaw piece 120a, the portion of the second seesaw piece 120b, and the supporting portions 130 and 132.

The third dummy electrode 70c is electrically connected to the third movable element 20c. The third electrode 70c is electrically connected to the third movable element 20c via, for example, a wiring (not illustrated) provided on the surface of the post portion 17, the fixing portion 140, and the supporting portions 130 and 132. As shown in FIG. 1, the third dummy electrode 70c is electrically connected to the first terminal 91 via the second wiring 82, the second dummy electrode 70b, the first wiring 81, the first dummy electrode 70a, and the fifth wiring 85. Thus, the third movable element 20c is electrically connected to the first terminal 91. The movable elements 20a, 20b, and 20c are electrically connected to one another.

As shown in FIG. 6, the fourth dummy electrode 70d is provided on the substrate 10. The fourth dummy electrode 70d is provided on the bottom face 16a of the concave portion 16. The fourth dummy electrode 70d is provided at the opposite side of the first fixed electrode portion 150 from the third dummy electrode 70c. In the illustrated example, the fourth dummy electrode 70d is provided at a negative X-axis side of the first fixed electrode portion 150 in the X-axis direction. The fourth dummy electrode 70d is disposed so as to face the first seesaw piece 120a. That is, the fourth dummy electrode 70d overlaps the first seesaw piece 120a in a planar view.

As shown in FIG. 1, the fourth dummy electrode 70d is electrically connected to the first terminal 91 via the third wiring 83, the second dummy electrode 70b, the first wiring 81, the first dummy electrode 70a, and the fifth wiring 85.

The third dummy electrode 70c and the fourth dummy electrode 70d make it possible to reduce the degree of adherence of the third movable element 20c (the structural element 4) to the substrate 10 by reducing electrostatic forces which arise between the third movable element 20c (the structural element 4) and the substrate 10. Thus, for example, when manufacturing the electronic device 100, it is possible to prevent the occurrence of a problem in that the structural element 4 is pulled toward the side of the substrate 10 by the electrostatic forces which are caused by an electric potential difference arising between the structural element 4 and the substrate 10

As shown in FIG. 6, the fifth dummy electrode 70e is provided on the substrate 10. The fifth dummy electrode 70e is provided on the bottom face 16a of the concave portion 16. The fifth dummy electrode 70e is provided at the opposite side of the second fixed electrode portion 152 from the third dummy electrode 70c. In the illustrated example, the fifth dummy electrode 70e is provided at a positive X-axis side of the second fixed electrode portion 152 in the X-axis direction. The fifth dummy electrode 70e does not face the third movable element 20c. That is, the fifth dummy electrode 70e does not overlap the third movable element 20c in a planar view.

As shown in FIG. 1, the fifth dummy electrode 70e is electrically connected to the first terminal 91 via the fourth wiring 84, the first dummy electrode 70a, and the fifth wiring 85.

A distance between the third dummy electrode 70c and the first fixed electrode portion 150, a distance between the third dummy electrode 70c and the second fixed electrode portion 152, a distance between the fourth dummy electrode 70d and the first fixed electrode portion 150, and a distance between the fifth dummy electrode 70e and the second fixed electrode portion 152 are, for example, equal to one another.

Through a method of providing the fifth dummy electrode 70e, the number of dummy electrodes adjacent to the first fixed electrode portion 150 can be made equal to the number of dummy electrodes adjacent to the second fixed electrode portion 152. Thus, a sum of a parasitic capacitance between the first fixed electrode portion 150 and the dummy electrode 70c adjacent to the first fixed electrode portion 150 and a parasitic capacitance between the first fixed electrode portion 150 and the dummy electrode 70d adjacent to the first fixed electrode portion 150 can be made, for example, equal to a sum of a parasitic capacitance between the second fixed electrode portion 152 and the dummy electrode 70c adjacent to the second fixed electrode portion 152 and a parasitic capacitance between the second fixed electrode portion 152 and the dummy electrode 70e adjacent to the second fixed electrode portion 152. This configuration makes the detection of the acceleration using the difference detection method in the third functional element 103 more accurate.

In addition, as shown in FIG. 5, the width W3x of the third functional element 103 in the X-axis direction is, for example, a distance between a negative X-axis side edge of the fourth dummy electrode 70d in the X-axis direction and a positive X-axis side edge of the fifth dummy electrode 70e in the X-axis direction. The width W3y of the third functional element 103 in the Y-axis direction is, for example, a distance between a positive Y-axis side edge of the fifth dummy electrode 70e in the Y-axis direction and a negative Y-axis side edge of the fifth dummy electrode 70e in the Y-axis direction.

Next, the operation of the third functional element will be described.

In the third functional element 103, the movable element 20c swings about the supporting axis Q in accordance with a physical quantity, such as acceleration or angular velocity. With this movement of the third movable element 20c, a distance between the first movable electrode portion 121 and the first fixed electrode portion 150 and a distance between the second movable electrode portion 122 and the fixed electrode portion 152 vary.

Specifically, when acceleration in an upward vertical direction (i.e., acceleration toward a positive Z-axis side in the Z-axis direction) is applied to the third functional element 103, the third movable element 20c rotates in a counterclockwise direction, thereby making a distance between the first movable electrode portion 121 and the first fixed electrode portion 150 smaller, and making a distance between the second movable electrode portion 122 and the fixed electrode portion 152 larger. As a result, the capacitance C1 becomes larger and the capacitance C2 becomes smaller.

Further, when acceleration in a downward vertical direction (i.e., acceleration toward a negative Z-axis side in the Z-axis direction) is applied to the third functional element 103, the third movable element 20c rotates in a clockwise direction, thereby making the distance between the first movable electrode portion 121 and the first fixed electrode portion 150 larger, and making the distance between the second movable electrode portion 122 and the fixed electrode portion 152 smaller. As a result, the capacitance C1 becomes smaller and the capacitance C2 becomes larger.

Thus, for the third functional element 103, it is possible to detect a physical quantity, such as a direction and a quantity of the acceleration or a direction and a quantity of the angular velocity, by means of a so-called difference detection method, that is, on the basis of a difference between the capacitance C1, which is measured by using, for example, the terminals 91 and 95, and the capacitance C2, which is measured by using, for example, the terminals 91 and 94.

In addition, the layout of the functional elements 101, 102, and 103 is not particularly restricted. For example, in FIG. 1, the second functional element 102 may be disposed at a position where the first functional element 101 is currently located, and the first functional element 101 may be disposed at a position where the second functional element 102 is currently located.

The electronic device 100 has, for example, the flowing characteristics.

The electronic device 100 includes the first wiring 81 which interconnects the first dummy electrode 70a and the second dummy electrode 70b. Thus, in the electronic device 100, for example, through a method of connecting the first terminal 91 to the first dummy electrode 70a by using the fifth wiring 85, it is possible to supply an electric potential to the two dummy electrodes 70a and 70b through the first terminal 91. In this manner, in the electronic device 100, it is possible to supply an electric potential to the two dummy electrodes 70a and 70b through the single terminal 91. Thus, in the electronic device 100, as compared with a case where two terminals are provided in order to supply an electric potential to each of the two dummy electrodes through a corresponding one of the two terminals, it is possible to make the number of the terminals smaller. As a result, the electronic device 100 becomes configured to be able to be downsized.

Here, for example, when assuming that the first dummy electrode of the first functional element is connected to a first terminal by using a first wiring and the second dummy electrode of the second functional element is connected to a second terminal by using a second wiring, and further, the third functional element is disposed between the second functional element and the second terminal in a planar view, the necessity of drawing a pattern of the second wiring around so as to avoid the third functional element is likely to make the length of the second wiring longer and, as a result, make an amount of wiring resistance thereof larger.

The electronic device 100, however, includes the wiring 81 which interconnects the first dummy electrode 70a and the second dummy electrode 70b, and thus, it is unnecessary to provide a long wiring for interconnecting the second dummy electrode 70b and a terminal. Accordingly, in the electronic device 100, for example, an efficient wiring layout can be realized, thereby enabling the electronic device 100 to be downsized to a greater degree. Moreover, in the electronic device 100, a smaller amount of wiring resistance can be realized, thereby enabling the electronic device 100 to detect the acceleration more accurately.

The electronic device 100 includes the second wiring 82 which interconnects the second dummy electrode 70b and the third dummy electrode 70c. In this manner, in the electronic device 100, the dummy electrodes 70a, 70b, and 70c are configured to be electrically connected to one another, and thus, it is possible to supply an electric potential to the three dummy electrodes 70a, 70b, and 70c through the single terminal 91. Thus, in the electronic device 100, as compared with a case where three terminals are provided in order to supply an electric potential to each of the three dummy electrodes through a corresponding one of the three terminals, it is possible to make the number of the terminals smaller.

In the electronic device 100, the first dummy electrode 70a is electrically connected to the first movable element 20a, the second dummy electrode 70b is electrically connected to the second movable element 20b, and the third dummy electrode 70c is electrically connected to the third movable element 20c. Thus, in the electronic device 100, since the movable elements 20a, 20b, and 20c are electrically connected to the dummy electrodes 70a, 70b, and 70c, it is possible to supply an electric potential to the movable elements 20a, 20b, and 20c and dummy electrode 70a, 70b, and 70c through the single terminal 91. Accordingly, in the electronic device 100, as compared with a case where an electric potential is supplied to each of the movable elements and dummy electrodes through a corresponding one of separately provided terminals, it is possible to make the number of the terminals smaller.

The electronic device 100 includes the third wiring 83 which interconnects the second dummy electrode 70b and the fourth dummy electrode 70d. Thus, in the electronic device 100, since the dummy electrodes 70a, 70b, 70c, and 70d are electrically connected to one another, it is possible to supply an electric potential to the four dummy electrodes 70a, 70b, 70c, and 70d through the single terminal 91. Accordingly, in the electronic device 100, as compared with a case where four terminals are provided in order to supply an electric potential to each of the four dummy electrodes through a corresponding one of the four terminals, it is possible to make the number of terminals smaller.

The electronic device 100 includes the fourth wiring 84 which interconnects the first dummy electrode 70a and the fifth dummy electrode 70e. Thus, in the electronic device 100, since the dummy electrodes 70a, 70b, 70c, 70d, and 70e are electrically connected to one another, it is possible to supply an electric potential to the five dummy electrodes 70a, 70b, 70c, 70d, and 70e through the single terminal 91. Accordingly, in the electronic device 100, as compared with a case where five terminals are provided in order to supply an electric potential to each of the five dummy electrodes through a corresponding one of the five terminals, it is possible to make the number of the terminals smaller.

In the electronic device 100, the second functional element 102 is provided at a position which is located at one X-axis side of the first functional element 101 in the X-axis direction, and the third functional element 103 is provided at a position which is located at one X-axis side of the first functional element 101 in the X-axis direction and which is located at one Y-axis side of the second functional element 102 in the Y-axis direction. Moreover, in the electronic device 100, for example, the width W1y of the first functional element 101 in the Y-axis direction is larger than the width W1x of the first functional element 101 in the X-axis direction, the width W2x of the second functional element 102 in the X-axis direction is larger than the width W2y of the second functional element 102 in the Y-axis direction, and the width W3x of the third functional element 103 in the X-axis direction is larger than the width W3y of the third functional element 103 in the Y-axis direction. Thus, in the electronic device 100, as compared with a case where, for example, the three functional elements are arranged in the X-axis direction, it is possible to make the width (size) of the electronic device 100 in the X-axis direction narrower (smaller).

In the electronic device 100, the dummy electrodes 70a, 70b, 70c, 70d, and 70e and the wirings 81, 82, 83, 84, and 85 are provided as a unified structure. Thus, it is possible to make a probability of the occurrence of a broken wiring failure smaller, as compared with a case where each of the dummy electrodes is composed of a member different from a member of each of the wirings.

2. Manufacturing Method for Electronic Device

Next, a manufacturing method for an electronic device according to this embodiment will be described with reference to some of the drawings. FIGS. 7A, 7B, 8A, 8B, 9A and 9B are cross-sectional views each schematically illustrating a manufacturing process for the electronic device 100 according to this embodiment. In addition, in FIGS. 7A, 7B, 8A, 8B, 9A and 9B, FIGS. 7A, 8A, and 9A correspond to FIG. 3, and FIGS. 7B, 8B, and 9B correspond to FIG. 6.

First, referring to FIGS. 7A and 7B, the concave portions 12, 14, and 16, the post portion 17, and the groove portions 18 are formed through a process of patterning, for example, a glass substrate (specifically, through a method of patterning using a photolithography technique or an etching technique). Through this process, it is possible to obtain the substrate 10 in which the concave portions 12, 14 and 16, the post portion 17, and the groove portions 18 have been formed.

Next, the first dummy electrode 70a is formed on the bottom face 12a of the concave portion 12; the second dummy electrode 70b is formed on the bottom face 14a of the concave portion 14; and the dummy electrodes 70c, 70d, and 70e are formed on the bottom face 16a of the concave portion 16. The dummy electrodes 70a, 70b, 70c, 70d, and 70e and the wirings 81, 82, 83, 84, and 85 are formed through a process of patterning a dielectric layer (not illustrated) having been formed by means of a sputtering method or a chemical vapor deposition (CVD) method. Through this process, it is possible to form the dummy electrodes 70a, 70b, 70c, 70d, and 70e and the wirings 81, 82, 83, 84, and 85 as a unified structure.

Next, the contact portions 8 are each formed on a corresponding one of the wirings 81, 82, 83, 84, and 85. Next, the terminals 91, 92, 93, 94, 95, 96, and 97 are formed on the substrate 10. A group of the contact portions 8 and a group of the terminals 91, 92, 93, 94, 95, 96, and 97 are each formed through a corresponding one of processes of patterning a film having been formed by means of a sputtering method or a CVD method. It does not matter which of the process of forming the group of the contact portions 8 and the process of forming the group of the terminals 91, 92, 93, 94, 95, 96, and 97 is performed first.

In addition, each of the contact portions 8 is preferable to be formed so as to project upward from the upper face of the substrate 10. In this manner, it becomes possible to certainly bring each of the contact portions 8 into contact with a silicon substrate 6 described below. In this case, the contact portions 8 are crushed, for example, in a process of bonding the silicon substrate 6 to the substrate 10.

Figure 8A:
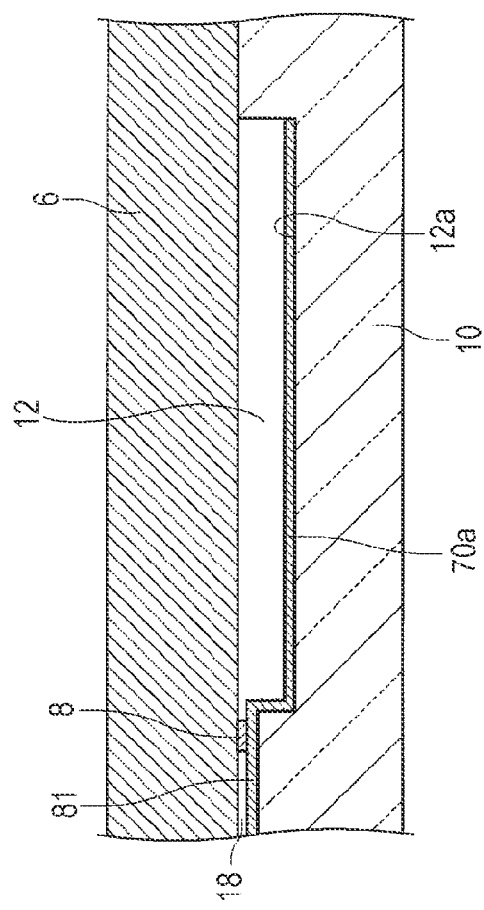
FIGS. 8A and 8B are cross-sectional views each schematically illustrating a manufacturing process for an electronic device according to an embodiment.
Figure 8B:
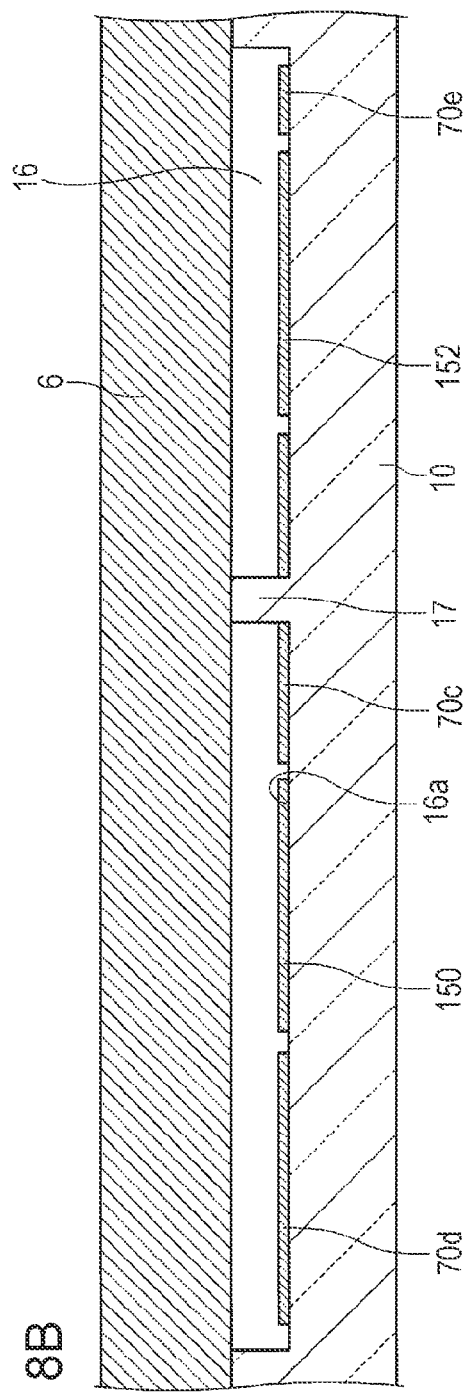

As shown in FIGS. 8A and 8B, for example, the silicon substrate 6 is bonded to the substrate 10. The substrate 6 is joined to the substrate 10 by means of, for example, anodic bonding. Through this process, the silicon substrate 6 can be tightly joined to the substrate 10.

Figure 9A:
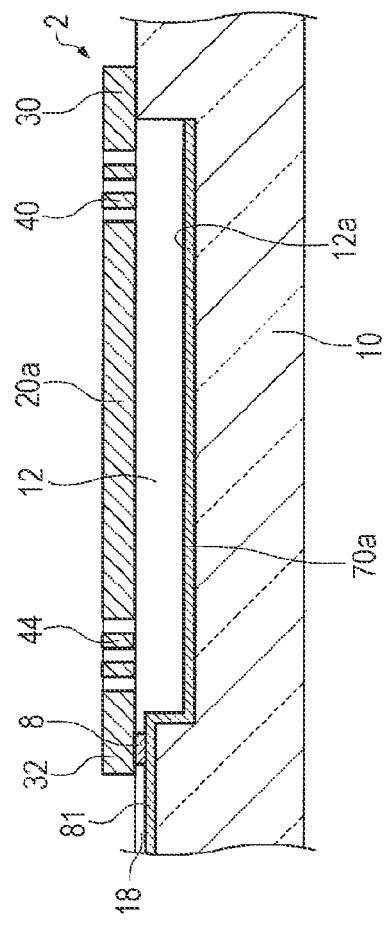
FIGS. 9A and 9B are cross-sectional views each schematically illustrating a manufacturing process for an electronic device according to an embodiment.
Figure 9B:
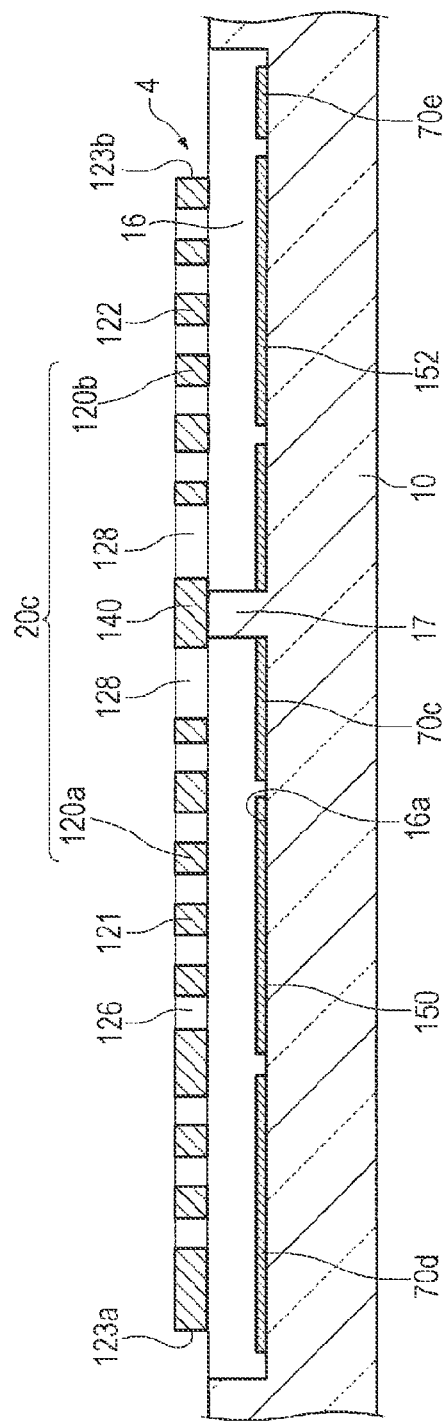

As shown in FIGS. 9A and 9B, after a process of grinding the silicon substrate 6 into a thin film by using, for example, a grinding machine, the functional elements 101, 102, and 103 are formed through a process of patterning the thin film into a thin film of an intended shape. An etching process for the pattering in this process may be performed by using a Bosch method.

As shown in FIGS. 3 and 6, the cover 110 is joined to the substrate 10 such that the cavity 111 formed by the substrate 10 and the cover 110 can contain the functional elements 101, 102, and 103. The cover 110 is joined to the substrate 10 by means of, for example, anodic bonding. In this manner, the cover 110 can be tightly joined to the substrate 10. It is possible to fill the cavity 111 with inactive gas by performing the above process under an inactive gas atmosphere.

In this process, the anodic bonding, which is performed in order to join the cover 110 to the substrate 10, causes a large electric potential difference between each of the movable elements 20a, 20b, and 20c (the structural elements 2, 3, and 4) and the substrate 10. The dummy electrode 70a, the dummy electrode 70b, and a pair of the dummy electrodes 70c and 70d, however, each make it possible to reduce electrostatic forces which arise between the substrate 10 and a corresponding one of the structural elements 2, 3, and 4. Similarly, each of the dummy electrodes 70a and 70b makes it possible to reduce the degree of adherence of the fixed electrode 60, 62, 64, and 66 to a corresponding one of the bottom faces 12a, 14a and 16a.

Through the above processes, the electronic device 100 can be manufactured.

3. Electronic Apparatus

Next, electronic apparatuses according to this embodiment will be described with reference to some of the drawings. Each of electronic apparatuses according to this embodiment includes an electronic device according to an aspect of the invention. Hereinafter, electronic apparatuses, each including the electronic device 100 as the electronic device according to an aspect of the invention, will be described.

Figure 10:
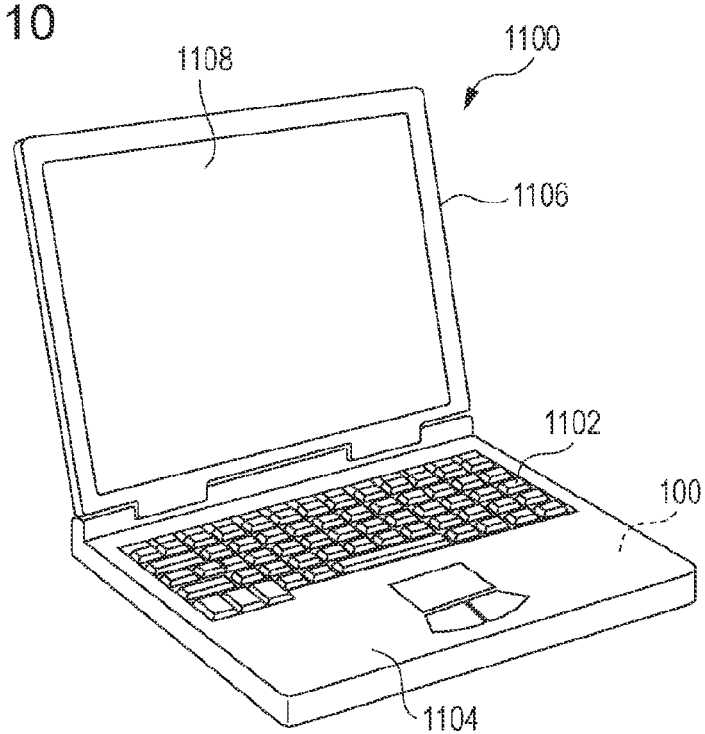
FIG. 10 is a perspective view schematically illustrating an electronic apparatus according to an embodiment.

FIG. 10 is a perspective view schematically illustrating a mobile type (or laptop type) personal computer 1100 as an electronic apparatus according to this embodiment.

As shown in FIG. 10, the personal computer includes a body portion 1104 provided with a keyboard 1102, as well as a display unit 1106 provided with a display 1108, and the display unit 1106 is supported so as to be pivotable about a hinge structure relative to the body portion 1104.

The personal computer 1100 configured in this manner incorporates the electronic device 100.

Figure 11:
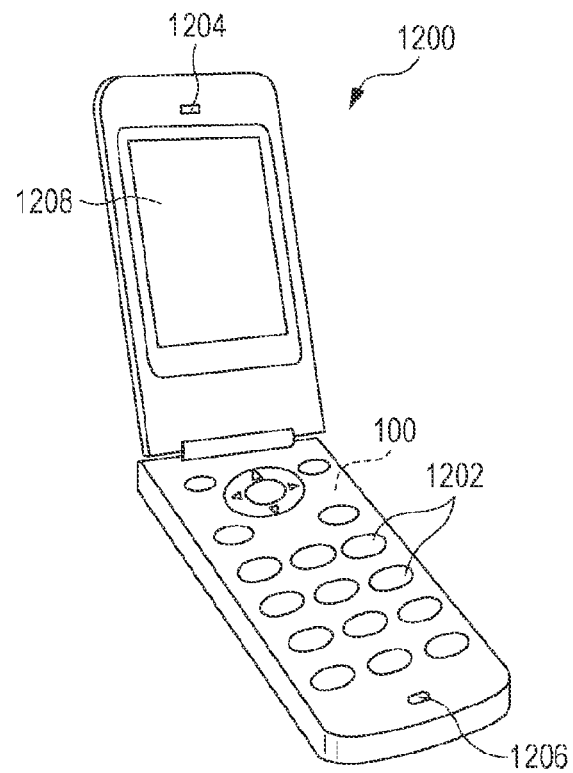
FIG. 11 is a perspective view schematically illustrating an electronic apparatus according to an embodiment.

FIG. 11 is a perspective view schematically illustrating a mobile phone 1200 (including a PHS phone) as an electronic apparatus according to this embodiment.

As shown in FIG. 11, the mobile phone 1200 includes a plurality of operation buttons 1202; an ear piece 1204; a mouthpiece 1206; and a display portion 1208 which is disposed between the operation buttons 1202 and the mouthpiece 1204.

The mobile phone 1200 configured in this manner incorporates the electronic device 100.

Figure 12:
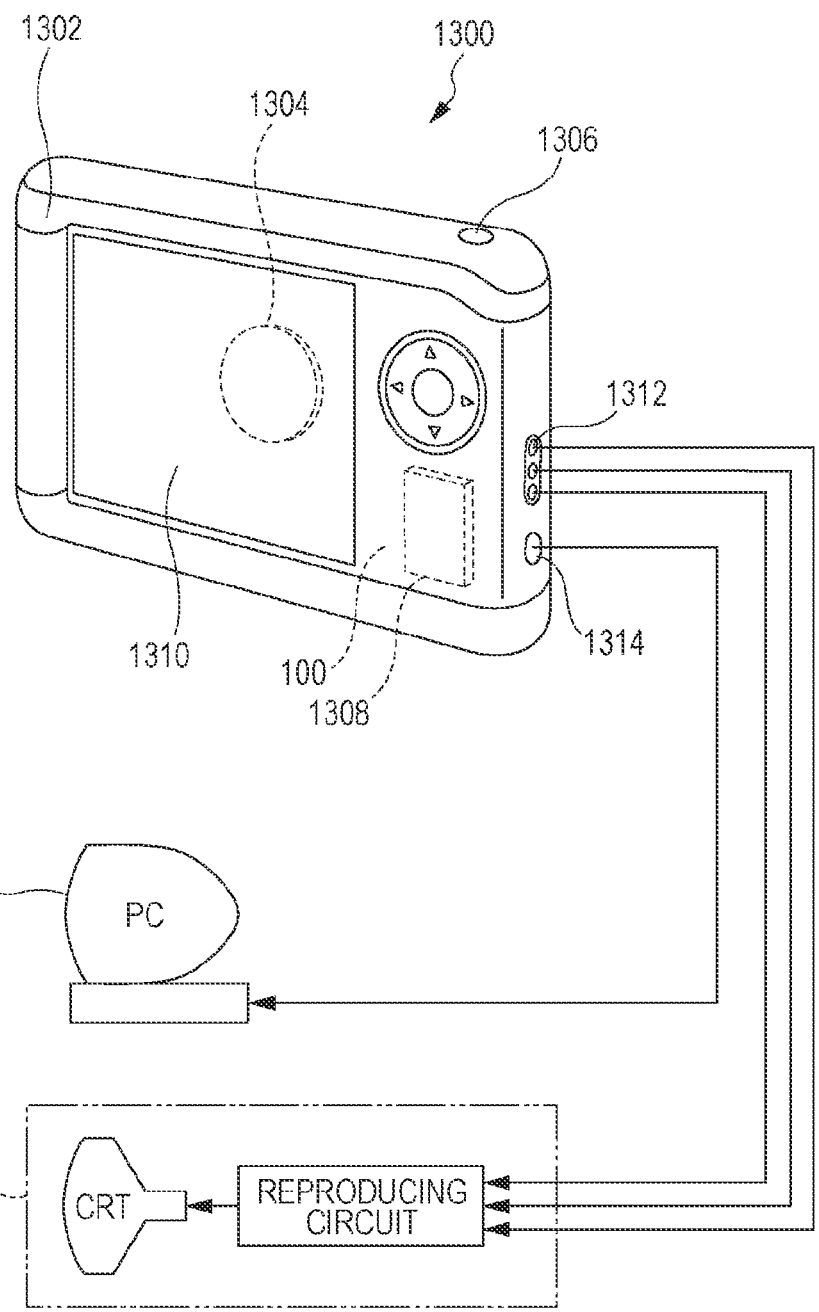
FIG. 12 is a perspective view schematically illustrating an electronic apparatus according to an embodiment.

FIG. 12 is a perspective view schematically illustrating a digital still camera 1300 as an electronic apparatus according to this embodiment. In addition, in FIG. 12, connections to external devices are also illustrated in a simple manner.

Here, in a general optical camera, a silver halide photographic film is caused to be exposed to an optical image of a photographic subject; while, in the digital still camera 1300, an optical subject image is photo-converted into an imaging signal by imaging elements, such as charge coupled devices (CCDs).

The digital still camera 1300 is configured such that a display portion 1310 is provided at the rear face of a case (body) thereof, and display operation of the display portion 1310 is performed on the basis of the imaging signal generated by the CCDs. Further, the display portion 1310 functions as a finder on which a photographic subject is displayed as an electronic image.

Further, a light receiving unit 1304 including optical lenses (an imaging optical system), the CCDs, and the like is provided at the front side of the case 1302 (at the back side in FIG. 12).

When a photographer pushes down a shutter button 1306 while viewing a subject image being displayed on the display portion 1310, an imaging signal, which has been generated by the CCDs at the time of the push down of the shutter button 1306, is transferred to a memory device 1308 and is stored therein.

Further, there are provided video signal output terminals 1312 and data communication input/output terminals 1314 on a side face of the case 1302. Further, when needed, a television monitor 1430 is connected to the video signal output terminals 1312, or a personal computer 1440 is connected to the data communication input/output terminals 1314. Moreover, the digital still camera 1300 is configured to, when a certain operation has been performed, output the imaging signal stored in the memory device 1308 to the television monitor 1430 or the personal computer 1440.

The digital still camera 1300 configured in this manner incorporates the electronic device 100.

Each of the above-described electronic apparatuses 1100, 1200, and 1300 includes the electronic device 100 and thus is configured to be able to be downsized.

In addition, such an electronic apparatus incorporating the electronic device 100 can be applied to any one of electronic apparatuses including, not only the personal computer (mobile type personal computer) shown in FIG. 10, the mobile phone shown in FIG. 11, and the digital still camera shown in FIG. 12, but also, for example, an ink jet discharging device (such as, an ink jet printer), a laptop type personal computer, a television set, a video camera, a videotape recorder, various navigation devices, a pager, an electronic notebook (including one having a communication function), an electronic dictionary, an electric calculator, an electronic gaming device, a head-mounted display, a word processor, a work station, a video phone, a security television monitor, a pair of electronic binoculars, a POS terminal, medical devices (such as an electronic thermometer, a blood pressure monitor, a blood glucose meter, an electrocardiogram measurement device, an ultrasonic diagnostic device, an electronic endoscope), a fish detector, various measurement tools, measuring instrument gauges (for use in, for example, a wheeled vehicle, an airplane, a rocket, and a ship), attitude controllers for use in a robot, a human body and the like, and a flight simulator.

4. Moving Object

Next, a moving object according to this embodiment will be described with reference to one of the drawings. A moving object according to this embodiment includes an electronic device according to an aspect of the invention. Hereinafter, a moving object including the electronic device 100 as the electronic device according to an aspect of the invention will be described.

Figure 13:
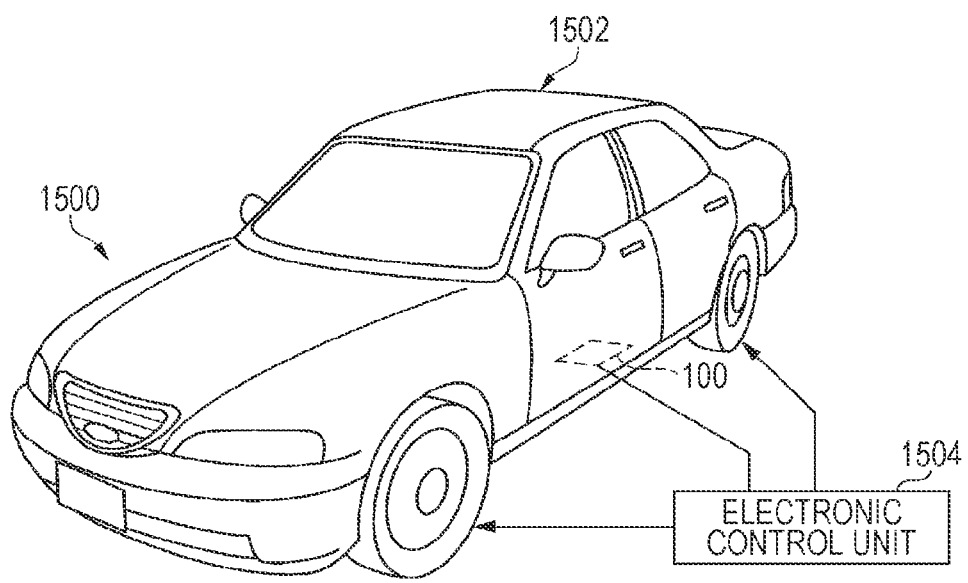
FIG. 13 is a perspective view schematically illustrating a moving object according to an embodiment.

FIG. 13 is a perspective view schematically illustrating an automobile 1500 as the moving object according to this embodiment.

The automobile 1500 incorporates the electronic device 100. Specifically, as shown in FIG. 13, in a car body 1502 of the automobile 1500, there is mounted an electronic control unit (ECU) 1504 which incorporates the electronic device 100 for detecting acceleration of the automobile 1500 and which performs control of the output of an engine. Further, the electronic device 100 can be widely applied to units and systems other than the ECU, such as an antilock brake system (ABS), an air-bag, and a tire pressure monitoring system (TPMS).

The automobile 1500 includes the electronic device 100 and thus is configured to be able to be downsized.

It is to be noted that the invention is not limited to the aforementioned embodiment, but can be variously modified when practiced within the scope of the gist of the invention.

For example, in the aforementioned embodiment, a case where each of the functional elements is an acceleration sensor (a physical-quantity sensor) has been described, but the invention is not limited to this case and may be embodied such that each of the functional elements is not the acceleration sensor but, for example, a gyro sensor for detecting angular velocity. Moreover, the invention may be embodied such that each of functional elements is an element, such as a micro electro mechanical systems (MEMS) oscillator, which is other than the sensor, such as the acceleration sensor or the angular velocity sensor.

Further, in the aforementioned embodiment, the first, second, and third axes have been described as three axes which are orthogonal to one another, but these three axes may not be ones that are orthogonal to one another, but ones that intersect with one another.

Further, in the aforementioned embodiment, an example, in which the first terminal 91 is electrically connected to the movable elements 20a, 20b, and 20c and the dummy electrodes 70a, 70b, 70c, 70d, and 70e, has been described, but the configuration may be made such that the dummy electrodes 70a, 70b, 70c, 70d, and 70e are electrically connected to the first terminal 91, and the movable elements 20a, 20b, and 20c are electrically connected to a terminal (not illustrated) different from the terminal 91. Further, the dummy electrodes 70a, 70b, 70c, 70d, and 70e may be supplied with an electric potential which is, for example, equal to an electric potential supplied to the movable elements 20a, 20b, and 20c. In this regard, however, in view of the downsizing of the electronic device 100, it is preferable that, just like the example described above, the dummy electrodes 70a, 70b, 70c, 70d, and 70e and the movable elements 20a, 20b, and 20c are supplied with an electric potential through only one terminal.

Further, in the aforementioned embodiment, as shown in FIG. 5, the third movable element 20c of the third functional element 103 is fixed to the substrate 10 by the single fixing portion 140. The invention is not limited to this configuration and may be embodied such that a third movable element of a third functional element is fixed to a substrate by two fixing portions. For example, in a planar view, each of such two fixing portions may be provided at a corresponding one of both edges of the third movable element and the third movable element may be supported through a method of connecting each of the two fixing portions to the third movable element by using a corresponding one of supporting portions.

The aforementioned embodiment and modification examples are just examples and the invention is not limited thereto. For example, the aforementioned embodiment and modification examples can be appropriately combined.

The invention includes any configuration which is essentially identical to any one of the configurations having been described in the above embodiment (for example, any configuration whose function, method, and result are identical to those of any one of the configurations having been described in the above embodiment, or any configuration whose objective and effect are identical to those of any one of the configurations having been described in the above embodiment). Further, the invention includes any configuration resulting from replacing at least one unessential portion of any one of the configurations having been described in the above embodiment. Further, the invention includes any configuration which brings about at least one action effect identical to that of any one of the configurations having been described in the above embodiment, or any configuration which makes it possible to achieve at least one objective identical to that of any one of the configurations having been described in the above embodiment. Further, the invention includes any configuration resulting from adding at least one publicly known technology to any one of the configurations having been described in the above embodiment.

The entire disclosure of Japanese Patent Application No. 2014-086545, filed Apr. 18, 2014 is expressly incorporated by reference herein.

What is claimed is:

1. An electronic device comprising:
   a first functional element including a first movable element that moves in a first axis direction, and a first dummy electrode;
   a second functional element including a second movable element that moves in a second axis direction intersecting with the first axis direction, and a second dummy electrode;
   a first wiring interconnecting the first dummy electrode and the second dummy electrode; and
   a first terminal that is electrically connected to the first dummy electrode,
   wherein an electric potential is applied to the first and second dummy electrodes by only the first terminal via the first wiring, and
   the first dummy electrode is electrically connected to the first movable element.

2. The electronic device according to claim 1, further comprising:
   a third functional element including a third movable element that moves in a third axis direction intersecting with the first axis direction and the second axis direction, and a third dummy electrode; and
   a second wiring interconnecting the second dummy electrode and the third dummy electrode,
   wherein the electric potential is applied to the first, second, and third dummy electrodes by only the first terminal via the first and second wirings.

3. The electronic device according to claim 2, wherein the first dummy electrode is electrically connected to the first movable element, the second dummy electrode is electrically connected to the second movable element, and the third dummy electrode is electrically connected to the third movable element.

4. The electronic device according to claim 2, further comprising:
   a third wiring interconnecting the second dummy electrode and a fourth dummy electrode that is further included in the third functional element, wherein the electric potential is applied to the first, second, third, and fourth dummy electrodes by only the first terminal via the first, second, and third wirings.

5. The electronic device according to claim 2, further comprising:
a fourth wiring interconnecting the first dummy electrode and a fifth dummy electrode that is further included in the third functional element,
wherein the electric potential is applied to the first, second, third, fourth, and fifth dummy electrodes by only the first terminal via the first, second, third, and fourth wirings.

6. The electronic device according to claim 2,
wherein the second functional element is provided at a position located at first side of the first functional element along the first axis direction, and
the third functional element is provided at a position located at the first side of the first functional element along the first axis direction and located at second side of the second functional element along the second axis direction.

7. The electronic device according to claim 6, wherein a width of the first functional element in the second axis direction is larger than a width of the first functional element in the first axis direction, a width of the second functional element in the first axis direction is larger than a width of the second functional element in the second axis direction, and a width of the third functional element in the first axis direction is larger than a width of the third functional element in the second axis direction.

8. A moving object comprising the electronic device according to claim 1.

9. The electronic device according to claim 1, wherein the first dummy electrode, the second dummy electrode, and the first wiring are provided as a unified structure.

10. The electronic device according to claim 3, further comprising:
a third wiring interconnecting the second dummy electrode and a fourth dummy electrode that is further included in the third functional element,
wherein the electric potential is applied to the first, second, third, and fourth dummy electrodes by only the first terminal via the first, second, and third wirings.

11. The electronic device according to claim 3, further comprising:
a fourth wiring interconnecting the first dummy electrode and a fifth dummy electrode that is further included in the third functional element,
wherein the electric potential is applied to the first, second, third, fourth, and fifth dummy electrodes by only the first terminal via the first, second, third, and fourth wirings.

12. The electronic device according to claim 3,
wherein the second functional element is provided at a position located at first side of the first functional element along the first axis direction, and
the third functional element is provided at a position located at the first side of the first functional element along the first axis direction and located at second side of the second functional element along the second axis direction.

13. The electronic device according to claim 12, wherein a width of the first functional element in the second axis direction is larger than a width of the first functional element in the first axis direction, a width of the second functional element in the first axis direction is larger than a width of the second functional element in the second axis direction, and a width of the third functional element in the first axis direction is larger than a width of the third functional element in the second axis direction.

14. An electronic apparatus comprising the electronic device according to claim 1.

15. The electronic device according to claim 4, further comprising:
a fourth wiring interconnecting the first dummy electrode and a fifth dummy electrode that is further included in the third functional element,
wherein the electric potential is applied to the first, second, third, fourth, and fifth dummy electrodes by only the first terminal via the first, second, third, and fourth wirings.

16. The electronic device according to claim 4,
wherein the second functional element is provided at a position located at first side of the first functional element along the first axis direction, and
the third functional element is provided at a position located at second side of the first functional element along the first axis direction and located at second side of the second functional element along the second axis direction.

17. The electronic device according to claim 16, wherein a width of the first functional element in the second axis direction is larger than a width of the first functional element in the first axis direction, a width of the second functional element in the first axis direction is larger than a width of the second functional element in the second axis direction, and a width of the third functional element in the first axis direction is larger than a width of the third functional element in the second axis direction.

* * * * *